US009633892B2

(12) United States Patent
Yamazaki et al.

(10) Patent No.: US 9,633,892 B2
(45) Date of Patent: Apr. 25, 2017

(54) METHOD FOR MANUFACTURING SOI SUBSTRATE IN WHICH CRYSTAL DEFECTS OF A SINGLE CRYSTAL SEMICONDUCTOR LAYER ARE REDUCED AND METHOD FOR MANUFACTURING SEMICONDUCTOR DEVICE

(75) Inventors: Shunpei Yamazaki, Setagaya (JP); Eriko Nishida, Atsugi (JP); Takashi Shimazu, Machida (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 287 days.

(21) Appl. No.: 12/410,643

(22) Filed: Mar. 25, 2009

(65) Prior Publication Data
US 2009/0246936 A1    Oct. 1, 2009

(30) Foreign Application Priority Data

Mar. 26, 2008  (JP) .................................. 2008-079509

(51) Int. Cl.
*H01L 21/762* (2006.01)

(52) U.S. Cl.
CPC .............................. *H01L 21/76254* (2013.01)

(58) Field of Classification Search
CPC ........... H01L 21/76254; H01L 21/3221; H01L 21/3225
USPC ............................ 257/E21.568; 438/458, 474
See application file for complete search history.

(56) References Cited

U.S. PATENT DOCUMENTS

| | | | |
|---|---|---|---|
| 3,929,529 A * | 12/1975 | Poponiak | 438/402 |
| 4,405,864 A * | 9/1983 | del Rio | 250/441.11 |
| 5,374,564 A | 12/1994 | Bruel | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |

(Continued)

FOREIGN PATENT DOCUMENTS

| | | |
|---|---|---|
| EP | 0961312 A | 12/1999 |
| EP | 1662549 A | 5/2006 |

(Continued)

*Primary Examiner* — Laura Menz
*Assistant Examiner* — Candice Y Chan
(74) *Attorney, Agent, or Firm* — Robinson Intellectual Property Law Office; Eric J. Robinson

(57) ABSTRACT

A method for manufacturing an SOI substrate in which crystal defects of a single crystal semiconductor layer are reduced even if a single crystal semiconductor substrate including crystal defects is used. A first oxide film is formed on a single crystal semiconductor substrate; the first oxide film is removed; a surface of the single crystal semiconductor substrate from which the first oxide film is removed is irradiated with laser light; a second oxide film is formed on the single crystal semiconductor substrate; an embrittled region is formed in the single crystal semiconductor substrate by irradiating the single crystal semiconductor substrate with ions through the second oxide film; bonding the second oxide film and the semiconductor substrate so as to face each other; and the single crystal semiconductor substrate is separated at the embrittled region by heat treatment to obtain a single crystal semiconductor layer bonded to the semiconductor substrate.

8 Claims, 23 Drawing Sheets

(56) References Cited

U.S. PATENT DOCUMENTS

| | | | |
|---|---|---|---|
| 6,403,450 B1* | 6/2002 | Maleville et al. | 438/471 |
| 6,468,923 B1* | 10/2002 | Yonehara et al. | 438/761 |
| 6,534,380 B1 | 3/2003 | Yamauchi et al. | |
| 6,602,761 B2 | 8/2003 | Fukunaga | |
| 6,613,678 B1 | 9/2003 | Sakaguchi et al. | |
| 6,803,264 B2 | 10/2004 | Yamazaki et al. | |
| 6,875,633 B2 | 4/2005 | Fukunaga | |
| RE39,484 E | 2/2007 | Bruel | |
| 7,183,177 B2* | 2/2007 | Al-Bayati et al. | 438/458 |
| 7,199,024 B2 | 4/2007 | Yamazaki | |
| 7,473,592 B2 | 1/2009 | Yamazaki et al. | |
| 7,476,576 B2 | 1/2009 | Yamazaki et al. | |
| 7,625,808 B2 | 12/2009 | Endo et al. | |
| 7,645,486 B2 | 1/2010 | Bourdelle et al. | |
| 7,745,252 B2 | 6/2010 | Suzuki et al. | |
| 7,928,510 B2 | 4/2011 | Watanabe | |
| 8,357,567 B2 | 1/2013 | Watanabe | |
| 2001/0007357 A1* | 7/2001 | Zhang et al. | 257/59 |
| 2002/0109144 A1 | 8/2002 | Yamazaki | |
| 2003/0170990 A1 | 9/2003 | Sakaguchi et al. | |
| 2004/0183133 A1* | 9/2004 | Takafuji et al. | 257/347 |
| 2006/0035450 A1* | 2/2006 | Frank et al. | 438/585 |
| 2007/0173000 A1 | 7/2007 | Yamazaki | |
| 2007/0281440 A1 | 12/2007 | Cites et al. | |
| 2008/0061301 A1 | 3/2008 | Yamazaki | |
| 2008/0067529 A1 | 3/2008 | Yamazaki | |
| 2008/0067597 A1 | 3/2008 | Yamazaki | |
| 2008/0083953 A1 | 4/2008 | Yamazaki | |
| 2008/0213953 A1 | 9/2008 | Yamazaki | |
| 2008/0246109 A1* | 10/2008 | Ohnuma | H01L 21/84 257/507 |
| 2008/0261376 A1 | 10/2008 | Yamazaki et al. | |
| 2008/0261379 A1 | 10/2008 | Jinbo et al. | |
| 2008/0268263 A1 | 10/2008 | Yamazaki | |
| 2008/0286941 A1 | 11/2008 | Yamazaki | |
| 2008/0286942 A1 | 11/2008 | Yamazaki | |
| 2008/0286952 A1 | 11/2008 | Miyairi et al. | |
| 2008/0286956 A1 | 11/2008 | Yamazaki | |
| 2008/0309718 A1* | 12/2008 | Oya et al. | 347/47 |
| 2008/0311709 A1 | 12/2008 | Ohnuma | |

FOREIGN PATENT DOCUMENTS

| | | |
|---|---|---|
| EP | 1760798 A | 3/2007 |
| JP | 56-038828 A | 4/1981 |
| JP | 56-103425 A | 8/1981 |
| JP | 02-054532 | 2/1990 |
| JP | 04-056223 A | 2/1992 |
| JP | 05-211128 | 8/1993 |
| JP | 05-326897 A | 12/1993 |
| JP | 08-316443 A | 11/1996 |
| JP | 09-186306 A | 7/1997 |
| JP | 2000-012864 | 1/2000 |
| JP | 2000-036583 A | 2/2000 |
| JP | 2000-077287 A | 3/2000 |
| JP | 2000-294754 | 10/2000 |
| JP | 2005-252244 | 9/2005 |
| JP | 2007-096277 A | 4/2007 |
| JP | 2007-123859 A | 5/2007 |
| JP | 2008-513600 | 5/2008 |
| WO | WO-2005/022610 | 3/2005 |
| WO | WO-2006/029651 | 3/2006 |
| WO | WO-2007/043285 | 4/2007 |
| WO | WO-2007/142852 | 12/2007 |

* cited by examiner

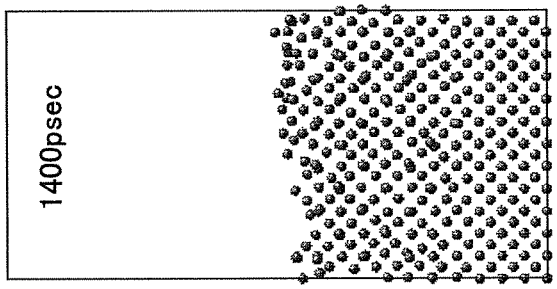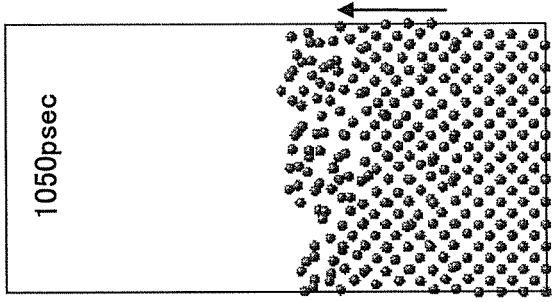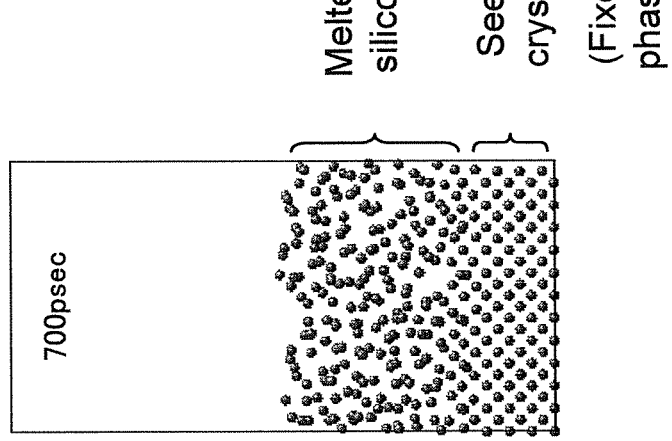

FIG. 15

| Accelerating Voltage | Hydrogen atom (H) ratio (X : Y) | Hydrogen ion species ratio (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

METHOD FOR MANUFACTURING SOI SUBSTRATE IN WHICH CRYSTAL DEFECTS OF A SINGLE CRYSTAL SEMICONDUCTOR LAYER ARE REDUCED AND METHOD FOR MANUFACTURING SEMICONDUCTOR DEVICE

BACKGROUND OF THE INVENTION

1. Field of the Invention

The present invention relates to a method for manufacturing an SOI substrate having a semiconductor layer formed over an insulating film and a method for manufacturing a semiconductor device.

2. Description of the Related Art

In recent years, instead of a bulk silicon wafer, integrated circuits using an SOI (silicon on insulator) substrate have been developed. By utilization of characteristics of a thin silicon wafer formed over an insulating film, semiconductor layers of transistors in the integrated circuit can be electrically separated from each other completely, and further the transistor can be a fully depleted transistor. Thus, a semiconductor integrated circuit with high added value such as high integration, high speed driving, and low power consumption can be realized.

A SIMOX substrate and a bonded substrate are known as an SOI substrate. For example, an SOI structure of a SIMOX substrate is obtained in such a manner that oxygen ions are implanted into a silicon wafer and heat treatment at greater than or equal to 1300° C. is performed to form a buried oxide (BOX) film, whereby a silicon wafer is formed on a surface of the substrate.

An SOI structure of a bonded substrate is obtained in such a manner that two silicon wafers (a base substrate and a bond substrate) are bonded to each other with an oxide film interposed therebetween and one of the silicon wafers (the bond substrate) is thinned from its rear surface (a surface which is not used for bonding), so that a silicon wafer is formed. Since it is difficult to form a uniform silicon wafer by grinding or polishing, a technique employing hydrogen ion implantation which is called Smart-Cut (registered trademark) has been proposed (e.g., Patent Document 1: Japanese Published Patent Application No. H5-211128).

The summary of the method for manufacturing an SOI substrate will be described below. By implantation of hydrogen ions into a silicon wafer by an ion implantation method, an embrittled region is formed at a predetermined depth from a surface of the silicon wafer. Next, another silicon wafer which serves as a base substrate is oxidized to form a silicon oxide film. After that, the silicon wafer into which hydrogen ions are implanted and the silicon oxide film of the silicon wafer which serves as a base substrate are bonded to each other to bond the two single crystal silicon substrates. Then, through heat treatment, cleavage is caused in the silicon wafer using an ion implanted layer as a cleavage plane, so that a substrate in which a thin single crystal silicon layer is bonded to the silicon wafer which serves as a base substrate is formed.

An ion implantation method is a method in which particles which are desired to be implanted into a sample are ionized in vacuum and accelerated by an electric field to be implanted into the sample. An ion implantation apparatus which is used for an ion implantation method includes an ion source, a mass separation unit, an acceleration unit, a beam operation (electrostatic scan) unit, an implantation chamber (an end station), and an evacuation unit. Further, since a cross section of an ion beam is not uniform, electrical scanning with an ion beam is performed in order to obtain uniformity on a surface of the sample. The implanted particles have a Gaussian distribution in the depth direction.

Further, as an example of a semiconductor device using an SOI substrate, a method for manufacturing a semiconductor device using a substrate with high heat resistance as a supporting substrate, by using Smart-Cut (registered mark) is disclosed (see Patent Document 2: Japanese Published Patent Application No. 2000-012864).

SUMMARY OF THE INVENTION

In general, in order to manufacture an SOI substrate as described above, a silicon wafer manufactured by Czochralski (CZ) method is used. In this silicon wafer manufactured by a CZ method, crystal defects which are caused at the time of crystal growth exist. Such crystal defects cause various crystal defects at the time of processing a wafer, at the time of manufacturing an SOI substrate, and in a process of manufacturing a semiconductor device.

Therefore, if an SOI substrate is manufactured using such a silicon wafer having crystal defects, it is difficult to obtain an SOI substrate with high crystallinity. Further, if crystal defects exist in an SOI substrate, the crystal defects have a significant effect on characteristics of a semiconductor device.

Further, in the case of reusing a silicon wafer from which a single crystal silicon layer is separated, crystal defects or damage due to separation remains in the silicon wafer or on a surface thereof and crystallinity is damaged; thus, it is difficult to obtain an SOI substrate with high crystallinity.

It is an object of one embodiment of the present invention to provide a method for manufacturing an SOI substrate in which crystal defects of a single crystal semiconductor layer are reduced. It is another object to provide a method for manufacturing a semiconductor device which has excellent electrical characteristics by using such an SOI substrate.

A method for manufacturing an SOI substrate according to one embodiment of the present invention includes the steps of forming an oxide film by performing thermal oxidation treatment on a single crystal semiconductor substrate, removing the oxide film, performing irradiation with laser light after removing the oxide film, and further forming an oxide film by performing thermal oxidation treatment on the single crystal semiconductor substrate. A specific structure of one embodiment of the present invention will be described below.

A method for manufacturing an SOI substrate according to one embodiment of the present invention includes the steps of: forming a first oxide film by performing first thermal oxidation treatment on a single crystal semiconductor substrate; removing the first oxide film formed on the single crystal semiconductor substrate; irradiating a surface of the single crystal semiconductor substrate from which the first oxide film is removed with laser light; forming a second oxide film on the single crystal semiconductor substrate by performing second thermal oxidation treatment on the single crystal semiconductor substrate; forming an embrittled region in the single crystal semiconductor substrate by irradiating the single crystal semiconductor substrate with ions through the second oxide film; bonding the second oxide film and one of surfaces of a semiconductor substrate so as to face each other; separating the single crystal semiconductor substrate at the embrittled region by performing heat treatment to obtain the single crystal semiconductor substrate and the semiconductor substrate to which a single crystal semiconductor layer is bonded; and irradiating the single crystal semiconductor layer bonded to the semiconductor substrate with laser light to melt the single crystal semiconductor layer, whereby the single crystal semiconductor layer is re-single-crystallized.

In this specification, the phrase "single crystal" refers to a crystal in which crystal planes or crystal axes are aligned and atoms or molecules which are included are aligned in a spatially ordered manner. However, although a single crystal is structured by orderly aligned atoms, a single crystal may include a lattice defect in which part of the alignment is disordered or a single crystal may include intended or unintended lattice distortion.

Note that a semiconductor device in this specification refers to general devices which can function by utilizing semiconductor characteristics, and electro-optical devices, semiconductor circuits, and electronic devices are all semiconductor devices.

Further, a display device in this specification includes a liquid crystal display device or a light-emitting display device in its category. The liquid crystal display device includes a liquid crystal element, and the light-emitting device includes a light-emitting element. The light-emitting element includes an element whose luminance is controlled by current or voltage in its category. Specifically, the light-emitting element includes an inorganic EL (electroluminescence) element, an organic EL element, and the like in its category.

According to one embodiment of the present invention, at the time of manufacturing an SOI substrate or a semiconductor device, an SOI substrate in which crystal defects which are caused in a single crystal semiconductor layer are reduced can be manufactured. A semiconductor device having excellent electrical characteristics can be manufactured using such an SOI substrate.

BRIEF DESCRIPTION OF THE DRAWINGS

In the accompanying drawings:

FIGS. 4A to 4C are views showing how the structure changes in the simulation (cross-sectional views of Y-Z plane);

FIG. 15 is a list of ratios of fitting parameters (hydrogen atom ratios and hydrogen ion species ratios);

DETAILED DESCRIPTION OF THE INVENTION

Figure 1A:
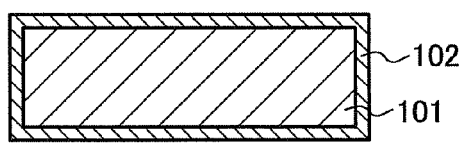
FIGS. 1A to 1H are views illustrating an example of a method for manufacturing an SOI substrate.

Embodiments of the present invention will be hereinafter described with reference to the accompanying drawings. Note that it is easily understood by those skilled in the art that the present invention can be implemented in many different modes and modes and details can be modified in a variety of ways without departing from the purpose and scope of the present invention. Therefore, the present invention should not be construed as being limited to the description below of Embodiments. Note that reference numerals indicating the same portions are used in common in all drawings describing Embodiments, and repeated descriptions thereof are omitted.

(Embodiment 1)

In this embodiment, an example of a method for manufacturing an SOI substrate will be described with reference to drawings. Specifically, a method will be described in which an oxide film is formed on a single crystal semiconductor substrate by performing thermal oxidation treatment on the single crystal semiconductor substrate and irradiation with laser light is performed after the oxide film is removed.

First, a single crystal semiconductor substrate 101 is prepared and washed as appropriate with a mixed solution of sulfuric acid and a hydrogen peroxide solution (SPM), a mixed solution of ammonia and a hydrogen peroxide solution (APM), a mixed solution of hydrochloric acid and a hydrogen peroxide solution (HPM), dilute hydrofluoric acid (DHF), ozone water, or the like. As the single crystal semiconductor substrate 101, a commercial single crystal semiconductor substrate can be used. For example, a single crystal silicon substrate, a germanium substrate, and a compound semiconductor substrate using gallium arsenide, indium phosphide, or the like are given. The size of a commercial silicon substrate is typically 5 inches (125 mm) in diameter, 6 inches (150 mm) in diameter, 8 inches (200 mm) in diameter, 12 inches (300 mm) in diameter, and 18 inches (450 mm) in diameter, and a typical shape thereof is a circular shape. Note that the shape is not limited to a circular shape, and a silicon substrate processed into a rectangular shape or the like can also be used. Hereinafter, a case where a single crystal silicon substrate is used as the single crystal semiconductor substrate 101 will be described.

Next, an oxide film 102 (also referred to as a "first oxide film") is formed by performing thermal oxidation treatment (also referred to as "first thermal oxidation treatment") on the single crystal semiconductor substrate 101 (FIG. 1A). In some cases, impurities such as metal are contained in the single crystal semiconductor substrate at the time of manufacturing the single crystal semiconductor substrate or in a processing process thereof. Then, the impurities such as metal could be contained in an SOI substrate which is completed finally. Thus, in this embodiment, oxidation in an oxidizing atmosphere to which halogen is added is preferably performed as the thermal oxidation treatment. As a gas for adding halogen to an oxidizing atmosphere, one or plural kinds of gases selected from HCl, HF, $NF_3$, HBr, $Cl_2$, DCE (dichloroethylene), $ClF_3$, $BCl_3$, $F_2$, $Br_2$, and the like can be used. In this embodiment, the thermal oxidation treatment is preferably performed in an atmosphere containing HCl at 0.5 vol % to 10 vol % (preferably 3 vol %) with respect to oxygen at a temperature of 900° C. to 1150° C. (typically 1000° C.). Treatment time may be 0.1 hour to 6 hours, preferably 0.5 hours to 1 hour. The thickness of the oxide film, which is to be formed, is 10 nm to 1000 nm (preferably 50 nm to 300 nm), for example 200 nm. Further, in the case of using trans-1,2-dichloroethylene as dichloroethylene, because the temperature at which trans-1,2-dichloroethylene is thermally decomposed is low, trans-1,2-dichloroethylene is effective when the thermal oxidation treatment is desired to be performed at a low temperature. Note that, instead of trans-1,2-dichloroethylene, cis-1,2-dichloroethylene, 1,1-dichloroethylene, or a mixed gas of two kinds or more of the above-described gases may be used.

As for the oxide film 102 formed on a surface of the single crystal semiconductor substrate 101 in the above-described manner, due to the effect of halogen (e.g., chlorine) contained in the oxidizing atmosphere, impurities such as metal are gettered into the oxide film 102, whereby the concentration of the impurities such as metal in the single crystal semiconductor substrate 101 is decreased or the impurities are removed. In other words, due to the effect of halogen, the impurities such as metal become volatile halide (e.g., chloride) and are diffused into the air, thereby being removed from the single crystal semiconductor substrate 101. This is effective for the single crystal semiconductor substrate 101 whose surface is processed by chemical mechanical polishing. Further, since the formation of the oxide film 102 by thermal oxidation treatment is performed at a temperature ranging from 900° C. to 1150° C., the crystallinity of the single crystal semiconductor substrate 101 is improved. Note that chemical mechanical polishing (CMP) is treatment for planarizing a surface by chemical and mechanical polishing using slurry in which an alkaline solution and polishing abrasive grains are mixed.

Figure 1B:
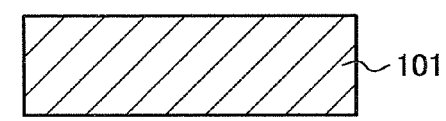

Next, the oxide film 102 into which the impurities such as metal have been gettered is removed (FIG. 1B). Although there is no particular limitation on the method of removing the oxide film 102 as long as the method is capable of removing the oxide film 102, the oxide film 102 can be removed using, for example, an etchant containing buffered fluoric acid or other etchant containing hydrofluoric acid. The oxide film 102 into which the impurities such as metal have been gettered is removed, so that the single crystal semiconductor substrate 101 in which impurities such as metal are reduced or from which impurities such as metal are removed can be obtained.

Figure 1C:
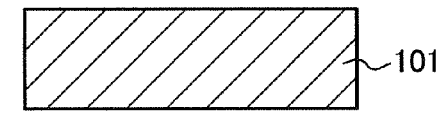

After the oxide film 102 is removed, the single crystal semiconductor substrate 101 is irradiated with laser light (FIG. 1C). The single crystal semiconductor substrate 101 can be melted by being irradiated with the laser light. It is preferable that the single crystal semiconductor substrate 101 be partially melted by the laser light irradiation. The phrase "partially melted state" refers to a state in which an upper part of the single crystal semiconductor substrate 101 is melted to be liquid while a lower part thereof is not melted to remain solid. When the temperature of a melt is set to be lower than the melting point after the single crystal semiconductor substrate 101 is in the partially melted state, atoms on the melt side are attached to a seed crystal at an interface between a solid phase part (seed crystal) of the single crystal semiconductor substrate 101 which is not melted and a liquid phase part (melt) of the single crystal semiconductor substrate 101 which is melted, whereby a crystal grows. The crystal grows in the above-described manner, so that unevenness of the surface as well as crystal defects in the single crystal semiconductor substrate 101 can be reduced.

As a laser emitting laser light, any of a continuous wave laser, a pulse laser (a pseudo continuous wave laser) whose repetition rate is greater than or equal to 10 MHz, and a pulsed laser can be used. A continuous wave laser or a pseudo continuous wave laser is preferably used in order to make the single crystal semiconductor substrate 101 in the partially melted state. A continuous wave laser or a pseudo continuous wave laser enables the entire single crystal semiconductor substrate 101 to be heated in the thickness direction for a long time, and accordingly projections called ridges can be prevented from being formed on the surface. For example, there are excimer lasers such as a KrF laser, gas lasers such as an Ar laser, a Kr laser, and $CO_2$ laser. In addition to the above-described lasers, there are solid lasers such as a YAG laser, a $YVO_4$ laser, a YLF laser, a $YAlO_3$ laser, a $GdVO_4$ laser, a KGW laser, a KYW laser, an alexandrite laser, a Ti:sapphire laser, and a $Y_2O_3$ laser. Note that an excimer laser is a pulsed laser, and some solid lasers such as a YAG laser can be used as any of a continuous wave laser, a pseudo continuous wave laser, and a pulsed laser.

The irradiation intensity of the laser light for reducing crystal defects of the single crystal semiconductor substrate 101 is preferably such intensity that the single crystal semiconductor substrate 101 can be in the partially melted state.

The laser light irradiation is preferably performed in an inert gas atmosphere such as a rare gas atmosphere or a nitrogen atmosphere, or in a vacuum state. A vacuum state or an inert gas atmosphere such as a nitrogen atmosphere is more effective in suppressing generation of cracks or ridges than an air atmosphere; thus, the applicable energy range of the laser light can be widened.

For example, in the case where laser light irradiation is performed in order to reduce defects caused at the time of crystal growth without performing thermal oxidation treatment, impurities such as metal existing on the surface of or inside the single crystal semiconductor substrate 101 could be diffused into the single crystal semiconductor substrate 101. As described above, the single crystal semiconductor substrate 101 from which the impurities such as metal have been removed is irradiated with laser light, so that the crystal defects of the single crystal semiconductor substrate 101 can be efficiently reduced. Further, the crystal defects existing in the single crystal semiconductor substrate 101 are reduced in advance, so that crystal defects caused later due to those crystal defects can be reduced.

Here, how the surface unevenness and nanoscale crystal defects of the single crystal semiconductor substrate are remedied by laser light irradiation will be described with use of classical molecular dynamics simulation. Specifically, the state is described in which an upper part of a single crystal silicon substrate having surface unevenness and nanoscale crystal defects is heated to be partially melted and silicon atoms are realigned using a solid phase remaining in a lower part of the single crystal silicon substrate as a seed crystal. Note that, in this simulation, the single crystal semiconductor substrate 101 is a single crystal silicon substrate.

In classical molecular dynamics method, function (interatomic potential) for the motion of real atoms is formed, the force acting on each atom is measured using the function, and Newton's equation of motion is solved, whereby motion (time evolution) of each atom can be tracked. In the actual simulation procedure, the following cycles are repeated:
(1) Initial conditions such as initial coordinate and initial speed (temperature) are given to atoms in the simulation.
(2) Interatomic force is calculated by interatomic potential.
(3) Positions and speed of the atoms after time step ($\Delta t$) are calculated.
(4) Back to (2).

Through the above-described set of procedures, the temporal trajectory of each atom can be obtained. Note that Materials Explorer 5.0 manufactured by Fujitsu Limited is used as software for classical molecular dynamics simulation for conducting the above-described simulation.

Although a variety of models are advocated for the interatomic potential of silicon, Tersoff potential which can reproduce physical properties obtained from experiment the best in the present circumstances is used in this embodiment. Note that, although there is a certain difference between the temperature in the Tersoff model and the actual temperature, the difference is just a problem in the simulation; therefore, conversion into the actual temperature based on the melting point is possible. The experimental value of the melting point of silicon is about 1414° C. and this corresponds to about 2327° C. in the Tersoff model. Hereinafter, the temperature which is converted based on the actual melting point of silicon is referred to as "conversion temperature" for the sake of convenience.

Next, a simulation model of planarization and recrystallization of the single crystal silicon substrate ((100) plane) and simulation conditions thereof will be described. The size of a unit cell for the simulation (a simulation unit cell) is 3.26 nm in the x-axis direction, 3.26 nm in the y-axis direction, and 6.52 nm in the z-axis direction. Here, the x axis and the y axis are in the direction parallel to the single crystal silicon substrate, and the z axis is in the thickness direction of the single crystal silicon substrate. Note that, for the simulation, a film which is sufficiently wide in the x-axis direction and the y-axis direction is assumed by application of periodic boundary conditions.

As the simulation model, a model having conditions described below was employed as a single crystal silicon substrate whose surface has unevenness and in which nanoscale crystal defects exist.
1. Pyramidal projection portions exist on the surface of the single crystal silicon substrate.
2. The height of the projection portion (the difference in height of the surface of the single crystal silicon substrate) is 1.36 nm.
3. Silicon atoms (191 atoms in total) existing in a region within 1 nm in radius with a central focus on the coordinate (1.63, 1.63, 2.17) are removed to form a spherical crystal defect with about 2 nm in diameter. Note that each parameter of the above-described coordinate corresponds to a distance (nm) from the original point.
4. The number of silicon atoms in the simulation unit cell is 1706.
5. 7 layers (504 atoms in total) on the lower side of the single crystal silicon substrate are used as a seed crystal; thus, the positions of the atoms are fixed (assuming a solid-phase state).

Figure 2A:
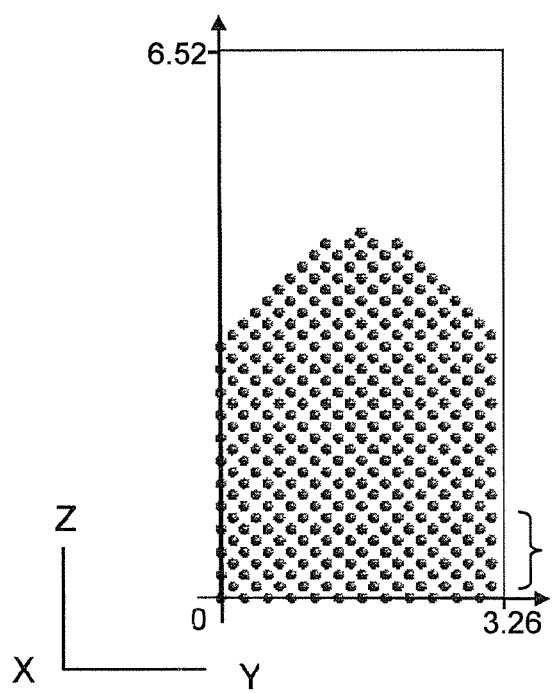
FIG. 2A is a view showing a simulation model and FIG. 2B is a cross-sectional view of Y-Z plane of FIG. 2A.
Figure 2B:
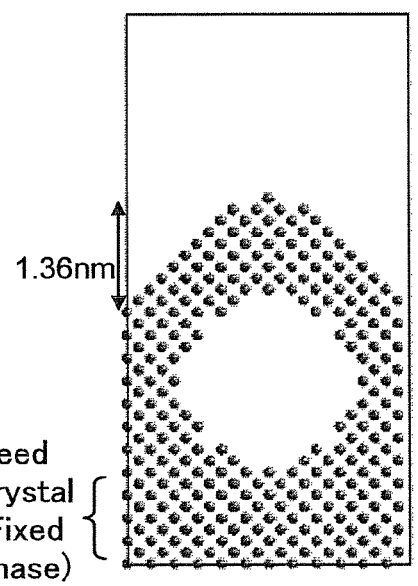
Figure 3A:
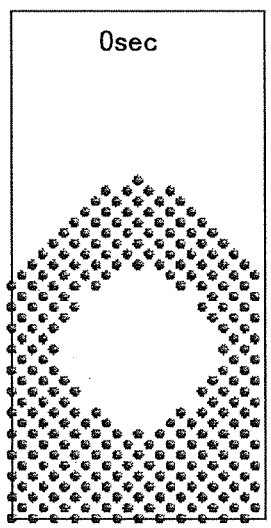
FIGS. 3A to 3F are views showing how the structure changes in the simulation (cross-sectional views of Y-Z plane)
Figure 3B:
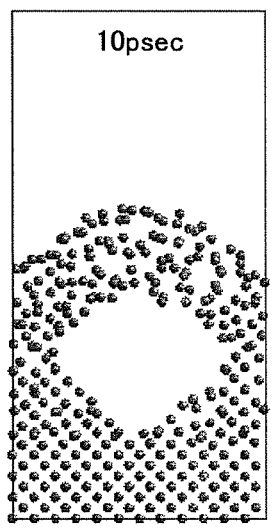
Figure 3C:
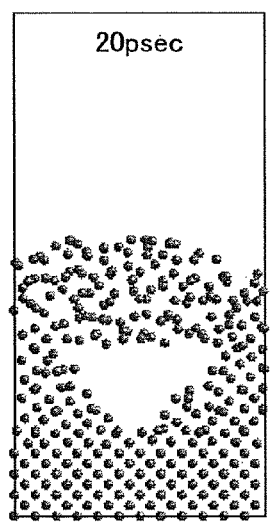
Figure 3D:
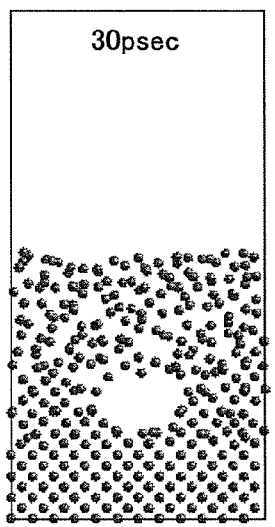
Figure 3E:
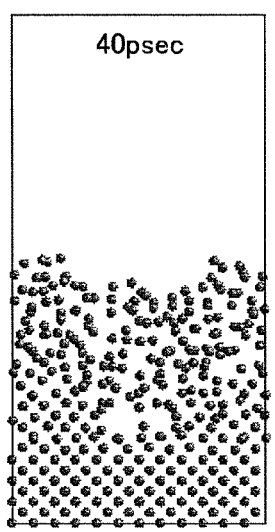
Figure 3F:
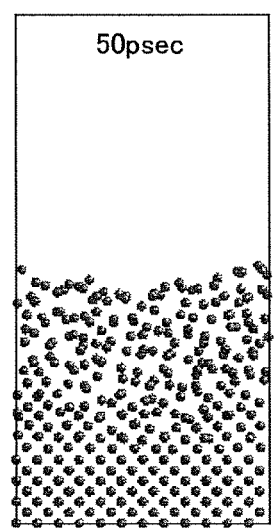

FIG. 2A shows the above-described simulation model seen from the direction perpendicular to the yz plane. In addition, FIG. 2B shows a cross section passing through the center of the spherical crystal defect in the plane which is parallel to the yz plane in the above-described simulation model. Note that FIG. 2B shows the above-described simulation model which has a thickness of 0.65 nm in the x-axis direction, and to be exact, it does not show only the cross section passing through the center of the spherical crystal defect.

Classical molecular dynamics simulation was performed using the above-described simulation model and setting the initial condition of the temperature as a conversion temperature of 1458° C. (higher than the melting point). Note that, in this embodiment, the simulation is performed with the temperature condition (conversion temperature of 1458° C.) fixed from the initial state (0 sec) to 700 psec.

FIGS. 3A to 3F show how the structure of the single crystal silicon substrate changes with time. FIGS. 3A to 3F show how the structure of the single crystal silicon substrate changes from the initial state (0 sec) to 50 psec at intervals of 10 psec. According to FIGS. 3A to 3F, it is found that the projection portion of the surface is melted in about 50 psec and the crystal defect is eliminated, and thus the single crystal silicon substrate is planarized.

In the simulation, classical molecular dynamics simulation was performed by lowering the temperature to a conversion temperature of 1276° C. which is lower than the melting point after 700 psec. Here, the temperature condition is also fixed (1276° C.) from 700 psec to 1400 psec. FIGS. 4A to 4C show how the structure of the single crystal silicon substrate changes from 700 psec to 1400 psec at intervals of 350 psec.

As shown in FIGS. 4A to 4C, it is found that a solid-liquid interface moves upward toward the surface of the single crystal silicon substrate as time passes and molten silicon is changed into crystal silicon using a solid-phase part as a seed crystal. When 1400 psec has passed, the single crystal silicon substrate was re-single-crystallized up to near its surface.

It is found from the simulation that when the upper part of the single crystal silicon substrate having surface unevenness and nanoscale crystal defect is heated to be melted, the crystal defect is eliminated and the surface unevenness is reduced. Further, it is also found that the silicon atoms are realigned using the solid-phase remaining in the lower part as a seed crystal, so that crystal growth proceeds.

According to the results of the above-described classical molecular dynamics simulation it is found that melting time of approximately 50 psec is enough as long as a crystal defect is approximately 2 nm in diameter and a difference in height of surface unevenness is approximately 1.5 nm.

Further, it is found that melting time of at least approximately 700 psec enables the silicon atoms to be realigned (re-single-crystallized) using the solid phase remaining in the lower part as a seed crystal. Thus, with use of a continuous wave laser or a pseudo continuous wave laser, the defect can be sufficiently fixed, and thus planarization treatment can be performed. Further, since the melting time of a semiconductor film in the case of using pulse laser light is generally substantially the same as the pulse width of laser light, it can be said that a crystal defect of approximately 2 nm and surface unevenness whose difference in height is approximately 1.5 nm can be remedied as long as the pulse width of laser light is greater than or equal to 50 psec. Similarly, it can be said that silicon atoms can be realigned (re-single-crystallized) as long as the pulse width is greater than or equal to 700 psec. That is, in order to realize the above-described reduction in crystal defects and surface unevenness and realignment (re-single-crystallization) of silicon atoms, pulse laser light having a pulse width of greater than or equal to 700 psec (e.g., 25 nsec) may be used.

In addition, in the case where desired planarity is not obtained for the surface of the single crystal semiconductor substrate 101, chemical mechanical polishing (CMP) is preferably performed in order to planarize the surface. The planarity of the single crystal semiconductor substrate 101 is increased, so that an oxide film 103 which is to be formed later can be formed to have planarity. Note that the planarization step may be omitted if desired planarity can be obtained by laser light irradiation.

Figure 1D:
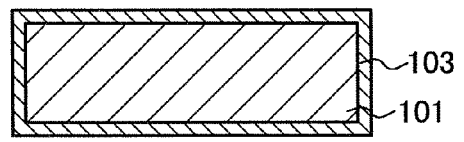

Next, the oxide film 103 (also referred to as a "second oxide film") is formed by performing thermal oxidation treatment (also referred to as "second thermal oxidation treatment") on the single crystal semiconductor substrate 101 (FIG. 1D). The second thermal oxidation treatment can be performed in a similar manner to the first thermal oxidation treatment. The thickness of the oxide film 103, which is formed, is 10 nm to 1000 nm (preferably 50 nm to 300 nm). The oxide film 103 obtained by the thermal oxidation treatment has a smooth and hydrophilic surface.

Further, halogen is contained in the oxide film 103 which is formed by thermal oxidation in an oxidizing atmosphere to which halogen is added. Halogen is contained at a concentration ranging from $1 \times 10^{16}/cm^3$ to $5 \times 10^{21}/cm^3$, so that a function, as a blocking layer, of capturing impurities such as metal and preventing contamination of the single crystal semiconductor substrate 101 can be developed. In addition, since a dangling bond on the surface of the single crystal semiconductor substrate 101 is terminated by the halogen used in the thermal oxidation treatment, localized level density at an interface between the oxide film 103 and the single crystal semiconductor substrate 101 can be reduced.

Note that, although the case where the thermal oxidation treatment is performed in an oxidizing atmosphere in which hydrogen chloride or dichloroethylene is contained as a formation method of the oxide film 102 and the oxide film 103 containing chlorine atoms is described in this embodiment, the present invention is not limited thereto. For example, chlorine atoms may be contained in the oxide film 102 in such a manner that chlorine ions which are accelerated by an electric field are added using an ion doping apparatus or an ion injecting apparatus after the oxide film 102 (e.g., SiOx) is formed on the surface of the single crystal semiconductor substrate 101 by performing thermal oxidation treatment on the single crystal semiconductor substrate 101 in an oxidizing atmosphere (FIG. 1A). Alternatively, thermal oxidation treatment may be performed in an oxidizing atmosphere after the surface is processed with a hydrogen chloride (HCl) solution.

Figure 1E:
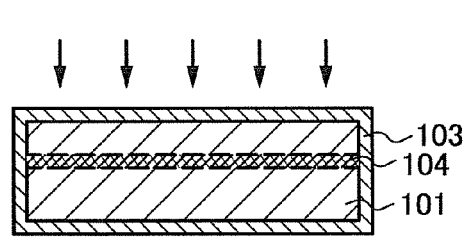

Next, the single crystal semiconductor substrate 101 is irradiated with ions through the oxide film 103, so that ions are introduced into the single crystal semiconductor substrate 101 and an embrittled region 104 is formed at a predetermined depth from one of surfaces of the single crystal semiconductor substrate 101 (FIG. 1E).

The depth at which the embrittled region 104 is formed can be controlled by ion species, the kinetic energy of ions, and the incident angle of ions. The kinetic energy can be controlled by accelerating voltage or the like. The embrittled region 104 is formed at substantially the same depth as the average depth at which ions enter. The depth to which ions are introduced determines the thickness of a single crystal semiconductor layer which is to be separated from the single crystal semiconductor substrate 101 in a later step. The depth at which the embrittled region 104 is formed is greater than or equal to 10 nm and less than or equal to 500 nm, preferably greater than or equal to 50 nm and less than or equal to 200 nm.

An ion doping apparatus can be used in order to introduce ions to the single crystal semiconductor substrate 101. In an ion doping apparatus, a source gas is excited to generate plasma, ions are extracted from the plasma, and the ions are introduced into an object to be processed without any mass separation being performed. With use of an ion doping apparatus, the single crystal semiconductor substrate 101 can be uniformly doped with ions. Note that in an ion doping apparatus provided with a mass separator, ion implantation with mass separation can be performed.

Although, in the case of using an ion doping method, there are a hydrogen gas, a rare gas, and the like as a source gas which is used for introducing ions, a hydrogen gas is preferably used in this embodiment. In the case of using a hydrogen gas as a source gas, ions which are generated are $H^+$, $H_2^+$, and $H_3^+$, and it is preferable that the introduction amount of $H_3^+$ be the largest. The introduction efficiency of $H_3^+$ is better than that of $H^+$ and $H_2^+$; therefore, introduction time can be shortened when $H_3^+$ ions are used. Further, cracks are easily generated in the embrittled region 104 in a later step.

Due to introduction of ions into the single crystal semiconductor substrate 101 in the above-described manner, a large number of crystal defects are formed in the single crystal semiconductor substrate 101. If crystal defects caused at the time of crystal growth or crystal defects formed at the time of processing a wafer remain in the single crystal semiconductor substrate 101, crystal defects caused in the single crystal semiconductor substrate 101 which result from those crystal defects are increased. If a large number of such crystal defects remain in a region where a single crystal semiconductor layer is to be formed later, an SOI substrate with high quality cannot be obtained. Crystal defects caused at the time of crystal growth or crystal defects formed at the time of processing a wafer are reduced in advance by the method described in this embodiment, so that crystal defects which are formed at the time of introducing ions can be reduced.

In the case of using an ion doping method, ions are introduced without any mass separation being performed in an ion doping apparatus, and thus metal ions as well as hydrogen ions are also introduced into the single crystal semiconductor substrate 101 in some cases. Since the mass number of a metal ion is large, many metal ions are distributed on an outermost surface on the side into which the ions are introduced. In this embodiment, the oxide film 103 is formed on the surface of the single crystal semiconductor substrate 101. The oxide film 103 is formed thicker than the depth at which the metal ions are introduced, so that the distribution of the metal can be confined within the oxide film 103. When halogen is contained in the oxide film 103, a function of gettering impurities such as heavy metal which have an adverse effect on the single crystal semiconductor substrate 101 is obtained. Accordingly, the impurities captured in the oxide film 103 are confined, whereby contamination of the single crystal semiconductor substrate 101 can be prevented.

Next, a semiconductor substrate 111 for being bonded to the single crystal semiconductor substrate 101 is prepared. As the semiconductor substrate 111, a substrate similar to the substrate which is used as the single crystal semiconductor substrate 101 can be used. Further, a polycrystalline semiconductor substrate, a solar grade silicon (SOG-Si) substrate (whose silicon purity is, for example, 99.9999%) which is used for manufacture of a solar battery, or the like can alternatively be used. A polycrystalline semiconductor substrate described in this specification refers to not only a polycrystalline silicon substrate but also a polycrystalline compound semiconductor substrate, a polycrystalline silicon substrate containing a small amount of germanium, and a polycrystalline silicon substrate containing a small amount of boron.

In order to favorably bond the semiconductor substrate 111 and the oxide film 103, a bonding surface may be activated. For example, one or both of surfaces to be bonded is/are irradiated with an atom beam or an ion beam. In the case of using an atomic beam or an ion beam, a neutral atomic beam of an inert gas such as argon or an ion beam of an inert gas can be used. It is also possible to activate the bonding surface by plasma irradiation or radical treatment. Such activation treatment facilitates bonding between the single crystal semiconductor substrate and the semiconductor substrate even at a temperature of less than or equal to 400° C.

Figure 1F:
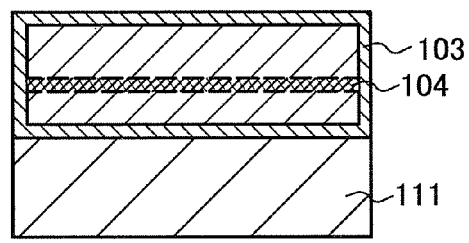

Next, the oxide film 103 and the semiconductor substrate 111 are bonded to each other so that the oxide film 103 and one of the surfaces of the semiconductor substrate 111 face each other (FIG. 1F). When the oxide film 103 and the semiconductor substrate 111 are disposed in close contact with each other, the substrates attract each other due to Van der Waals force. Then, Si—OHs which are formed on the surface of the substrates are bonded to each other by hydrogen bonding. By heat treatment at a low temperature (e.g., 150° C. to 200° C.), dehydration condensation reaction occurs and water molecules are released, so that a bond between silicon atoms through an oxygen atom (Si—O—Si) is formed. By further heat treatment at a high temperature (e.g., 600° C.), oxygen is diffused and a bond between silicon atoms is generated at an interface, so that a bond between the single crystal semiconductor substrate 101 and the semiconductor substrate 111 becomes stronger. In this embodiment, the oxide film 103 obtained by the thermal oxidation treatment is used as an insulating film for bonding the single crystal semiconductor substrate 101 and the semiconductor substrate 111. Since the oxide film 103 obtained by the thermal oxidation treatment is smooth, the single crystal semiconductor substrate 101 and the semiconductor substrate 111 can be favorably bonded to each other.

Note that surface treatment is preferably performed on the semiconductor substrate 111 and the oxide film 103 formed on the single crystal semiconductor substrate 101 before the single crystal semiconductor substrate 101 and the semiconductor substrate 111 are bonded to each other. As the surface treatment, ozone treatment (e.g., ozone water cleaning) or megasonic cleaning and ozone water cleaning can be performed. Alternatively, ozone water cleaning and cleaning with hydrofluoric acid may be repeated plural times. By such surface treatment, dust such as an organic matter on the surfaces of the oxide film 103 and the semiconductor substrate 111 can be removed, and thus the surface of the oxide film 103 can be hydrophilic.

One or both of heat treatment and pressure treatment is/are preferably performed after the single crystal semiconductor substrate 101 and the semiconductor substrate 111 are bonded to each other. Heat treatment or pressure treatment makes it possible to increase bond strength between the single crystal semiconductor substrate 101 and the semiconductor substrate 111. The heat treatment is performed at such a temperature that atoms or molecules introduced into the embrittled region 104 are not precipitated, and the heating temperature thereof is preferably less than or equal to 350° C. In other words, this heating temperature is such a temperature that a gas is not released from the embrittled region 104. The pressure treatment is performed so that pressure is applied perpendicularly to the bonding surface, in consideration of the pressure resistance of the single crystal semiconductor substrate 101 and the semiconductor substrate 111.

Figure 1G:
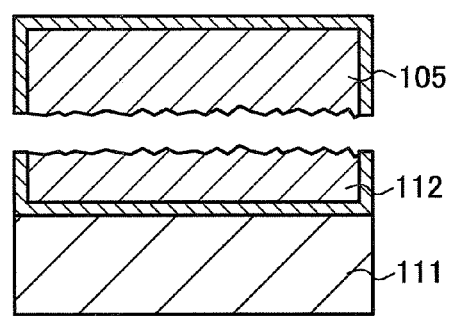

The heat treatment is performed on the single crystal semiconductor substrate 101, so that the single crystal semiconductor substrate 101 is separated at the embrittled region 104; accordingly, the semiconductor substrate 111 to which a single crystal semiconductor layer 112 is bonded and a single crystal semiconductor substrate 105 are obtained (FIG. 1G). For the heat treatment described here, a rapid thermal anneal (RTA) apparatus, a lamp rapid thermal anneal (LRTA) apparatus using a halogen lamp or an infrared lamp for heating can be used. It is preferable that the temperature of the semiconductor substrate 111 to which the single crystal semiconductor layer 112 is bonded be increased to a temperature ranging from 550° C. to 650° C. by this heat treatment.

In this embodiment, heat treatment using a vertical furnace having resistance heating is performed. The semiconductor substrate 111 to which the single crystal semiconductor substrate 101 is bonded is loaded into a boat of the vertical furnace. The boat is carried into a chamber of the vertical furnace. First, the chamber is exhausted to have a vacuum state in order to suppress oxidation of the single crystal semiconductor substrate 101. The degree of vacuum is approximately $5 \times 10^{-3}$ Pa. After making the vacuum state, nitrogen is supplied to the chamber, so that the chamber has a nitrogen atmosphere. During this process, the temperature is increased to 200° C.

After making the chamber have a nitrogen atmosphere, heating is performed at 200° C. for two hours. After that, the temperature is increased to 400° C. in an hour. After the state at a heating temperature of 400° C. becomes stable, the temperature is increased to 600° C. in an hour. After the state at a heating temperature of 600° C. becomes stable, heat treatment is performed at 600° C. for two hours. After that, the temperature is decreased to 400° C. in an hour, and 10 minutes to 30 minutes later, the boat is carried out of the chamber. The single crystal semiconductor substrate 101 and the semiconductor substrate 111 to which the single crystal semiconductor substrate 101 on the boat is bonded are cooled in an air atmosphere.

In the above-described heat treatment using a resistance heating furnace, heat treatment for increasing bonding force between the single crystal semiconductor substrate 101 and the semiconductor substrate 111 and heat treatment for generating separation at the embrittled region 104 are performed in succession. In the case where the two heat treatment is performed with different apparatuses, for example, heat treatment at a treatment temperature of 200° C. is performed for treatment time of two hours in a resistance heating furnace, and then the semiconductor substrate 111 and the single crystal semiconductor substrate 101 which are bonded to each other are carried out of the furnace, and then heat treatment is performed at a treatment temperature of greater than or equal to 600° C. and less than or equal to 700° C. for a treatment time of from 1 minute to 30 minutes with an RTA apparatus; accordingly, the single crystal semiconductor substrate 101 is separated at the embrittled region 104.

Separation (cleavage) is performed at the embrittled region 104 by the heat treatment in the above-described manner, so that the single crystal semiconductor layer 112 can be provided over the semiconductor substrate 111 with the oxide film 103 interposed therebetween (FIG. 1G).

Figure 1H:
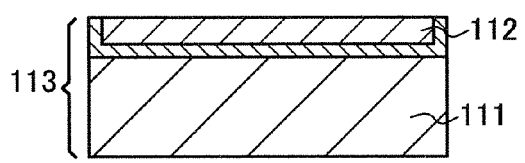

Damage due to the formation of the embrittled region 104 and the separation at the embrittled region 104 remains in and on the surface of the single crystal semiconductor layer 112 bonded to the semiconductor substrate 111, and accordingly the crystallinity or the planarity is damaged. Thus, planarization treatment is preferably performed on the single crystal semiconductor layer 112 which is obtained (FIG. 1H). Planarization treatment makes it possible to reduce crystal defects in and on the surface of the single crystal semiconductor layer 112, recover the crystallinity, and planarize the surface of the single crystal semiconductor layer 112. In addition, planarization treatment also makes it possible to reduce the thickness of the single crystal semiconductor layer 112.

As the planarization treatment, any one of CMP, etching treatment, and laser light irradiation, or a combination thereof can be performed. For example, it is preferable that laser light irradiation be performed after one of dry etching and wet etching, or etching treatment in which both dry etching and wet etching are combined (etch-back treatment) is performed.

In dry etching, as an etching gas, the following can be used: a chloride gas such as boron chloride, silicon chloride, or carbon tetrachloride; a chlorine gas; a fluoride gas such as sulfur fluoride and nitrogen fluoride; an oxygen gas; or the like. In wet etching, for example, tetramethylammonium hydroxide (TMAH) solution can be used as an etchant. Etching treatment makes it possible to remove the damage due to the separation, which remains on the surface of the single crystal semiconductor layer 112. Further, the damage existing on the surface of the single crystal semiconductor layer 112 is removed before laser light irradiation is performed, whereby the damage can be prevented from being taken into the single crystal semiconductor layer 112 when the single crystal semiconductor layer 112 is irradiated with laser light to be melted.

An upper surface of the single crystal semiconductor layer 112 is irradiated with laser light to be melted. After being melted, the single crystal semiconductor layer 112 is cooled and solidified, so that the single crystal semiconductor layer 112 with improved upper surface planarity can be obtained. With use of laser light, the semiconductor substrate 111 is not directly heated; thus, increase in the temperature of the semiconductor substrate 111 can be suppressed.

Note that the irradiation intensity of pulse laser light for reducing the defects of the single crystal semiconductor layer 112 is preferably set so that a melting state of the single crystal semiconductor layer by pulse laser light irradiation becomes a partially melted state or a state which is near the boundary between a partially melted state and a completely melted state (hereinafter, such a state is referred to as an "initial completely melted state"). This is because in the case where the single crystal semiconductor layer is made in the completely melted state other than the "initial completely melted state", the single crystal semiconductor layer is microcrystallized due to disordered nucleation after becoming liquid and the crystallinity of the single crystal semiconductor layer is highly likely to be decreased. Here, in this case, the phrase "partially melted state" means that the upper part of the single crystal semiconductor layer is melted to be liquid while the lower part thereof is not melted to remain solid. On the other hand, the phrase "completely melted state" means that the single crystal semiconductor layer is melted up to an interface between the single crystal semiconductor layer and an insulating layer which is formed thereunder to be in a liquid state.

On the other hand, in the case where the single crystal semiconductor layer is made in the partially melted state, crystal growth proceeds from a solid region which is not melted; thus, defects can be reduced with the crystallinity kept. Further, in the case where the single crystal semiconductor layer is made in the "initial completely melted state", solidification starts from near the interface between the single crystal semiconductor layer and the insulating layer formed thereunder due to downward diffusion of heat, and this is used as a seed crystal, so that another single-crystallization can be encouraged. In the "initial completely melted state", the alignment of atoms is not completely random, and especially near the interface between the single crystal semiconductor layer and the insulating layer formed thereunder, increase in temperature of which is small, the alignment of atoms are the same as that of the single crystal semiconductor layer which is in a solid state. Accordingly, it can be thought that defects can be reduced without decreasing the crystallinity by the solidification starting from near the interface between the single crystal semiconductor layer and the insulating layer formed thereunder. There is also possibility that solid which is not melted slightly remains near the interface between the single crystal semiconductor layer and the insulating layer formed thereunder and the solid which is not melted is used as a seed crystal, so that crystal growth proceeds.

A pulsed laser is preferably used for the laser light irradiation. This is because a pulsed laser is capable of instantaneously emitting pulsed laser light having high energy and easily forming a melted state. The repetition rate is preferably about greater than or equal to 1 Hz and less than or equal to 10 MHz.

The planarization treatment is performed in the above-described manner, whereby the crystal defects in the single crystal semiconductor layer can be reduced, the crystallinity can be recovered, and the surface of the single crystal semiconductor layer can be planarized. Note that, although the case where etching treatment is used when the damage of the surface of the single crystal semiconductor layer is removed is described in this embodiment, one embodiment of the present invention is not limited thereto, and CMP can alternatively be used.

Note that a step of reducing the thickness of the single crystal semiconductor layer 112 may be performed after the planarization treatment. For the thinning treatment performed on the single crystal semiconductor layer 112 (etch-back treatment), one of dry etching and wet etching, or etching treatment in which both dry etching and wet etching are combined may be performed. For example, in the case where the single crystal semiconductor layer 112 is a layer formed using a silicon material, it can be thinned by dry etching using $SF_6$ and $O_2$ as process gases, and a desired thickness of the single crystal semiconductor layer 112 can be obtained. The thickness of the single crystal semiconductor layer 112 obtained at this time is, for example, 10 nm to 150 nm, preferably 10 nm to 50 nm. The thinning treatment is not necessarily performed if a desired thickness of the single crystal semiconductor layer 112 is obtained after the planarization treatment.

Through the above-described steps, an SOI substrate 113 in which the single crystal semiconductor layer 112 is provided over the semiconductor substrate 111 with the oxide film 103 interposed therebetween can be manufactured. By use of the manufacturing method described in this embodiment, the single crystal semiconductor substrate 101 is irradiated with laser light after impurities such as metal contained in the single crystal semiconductor substrate 101 are removed, whereby crystal defects caused at the time of crystal growth or crystal defects formed at the time of processing a wafer, which exist in the single crystal semiconductor substrate 101, can be efficiently reduced. In addition, crystal defects existing in the single crystal semiconductor substrate 101 are reduced in advance, whereby crystal defects caused in a later step can be reduced. Furthermore, by planarization treatment performed on the inside and surface of the single crystal semiconductor layer 112 after separation of the single crystal semiconductor substrate 101, crystal defects in and on the surface of the single crystal semiconductor layer 112 can be reduced, the crystallinity can be recovered, and the surface can be planarized. As a result, an SOI substrate with excellent crystallinity in which crystal defects of the single crystal semiconductor layer 112 are reduced can be manufactured.

Figure 5:
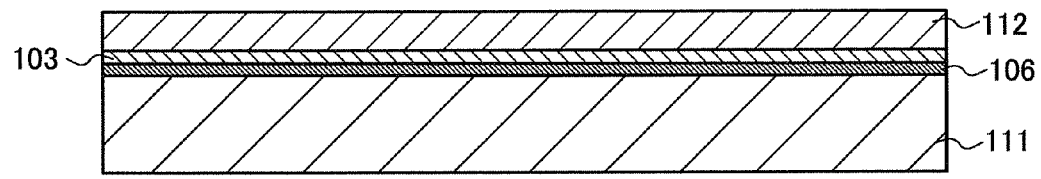
FIG. 5 is a view illustrating an example of a structure of an SOI substrate.

This embodiment is not limited to the structure illustrated in FIGS. 1A to 1H. For example, structures illustrated in FIG. 5, FIG. 6, and FIG. 7 may be employed. FIG. 5 illustrates a structure in which the single crystal semiconductor layer 112 is provided over the semiconductor substrate 111 with an insulating film 106 and the oxide film 103 interposed therebetween. The insulating film 106 is formed, over the semiconductor substrate 111, using a material having an oxidation property such as silicon oxide, silicon oxynitride, silicon nitride, or silicon nitride oxide. The insulating film 106 may be a single film using the above-described material or a layer in which a plurality of films are stacked.

For example, in the case of using silicon oxide for the insulating film 106, the insulating film 106 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. The thickness of the insulating film 106 can be 10 nm to 1000 nm (preferably 50 nm to 300 nm). In this case, a surface of the insulating film 106 may be densified with oxygen plasma treatment. In addition, in the case of using silicon nitride for the insulating film 106, the insulating film 106 can be formed by a vapor deposition method such as a plasma CVD method using a mixed gas of silane and ammonia. In addition, in the case of using silicon nitride oxide for the insulating film 106, the insulating film 106 can be formed using a mixed gas of silane and ammonium or a mixed gas of silane and nitrogen oxide by a vapor deposition method such as plasma CVD.

Alternatively, the insulating film 106 may be formed using silicon oxide which is formed with use of an organosilane gas by a chemical vapor deposition method. As the organosilane gas, the following may be used: a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

Note that in this specification, oxynitride refers to a substance in which the number of oxygen atoms is larger than the number of nitrogen atoms, whereas nitride oxide refers to a substance in which the number of nitrogen atoms is larger than the number of oxygen atoms. Note that a silicon oxynitride film means a film which contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 atomic %, 25 at. % to 35 at. %, and 0.1 at. % to 10 at. %, respectively. Further, a silicon nitride oxide film means a film which contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

After the insulating film 106 is formed over the semiconductor substrate 111, the semiconductor substrate 111 and the single crystal semiconductor substrate 101 in which the oxide film 103 is formed on the surface and the embrittled region 104 is formed in a region at a predetermined depth from the surface (FIGS. 1A to 1E) are bonded to each other with the insulating film 106 interposed therebetween. Next, heat treatment is performed to cause separation at the embrittled region 104, so that the single crystal semiconductor layer 112 can be formed on the semiconductor substrate 111 with the insulating film 106 and the oxide film 103 interposed therebetween. Note that planarization treatment may be performed on the single crystal semiconductor layer 112. The methods illustrated in FIGS. 1F to 1H may be used as methods of the above-described steps; therefore, detailed descriptions thereof are omitted.

Through the above-described steps, an SOI substrate illustrated in FIG. 5 can be manufactured. Note that, although the example in which the insulating film 106 is provided on the semiconductor substrate 111 side is described, one embodiment of the present invention is not limited to the example, and the insulating film 106 can alternatively be provided on the single crystal semiconductor substrate 101 side. In that case, the insulating film 106 can be formed on the oxide film 103 which is formed on the surface of the single crystal semiconductor substrate 101.

Since an oxide film obtained by thermal oxidation treatment is smooth, the smoothness of the insulating film 106 can also be improved when the insulating film 106 is formed on the oxide film. Thus, bonding between the single crystal semiconductor substrate and the semiconductor substrate can be favorably performed. Further, in the case where the insulating film 106 is formed on the semiconductor substrate 111 side, the insulating film 106 can function as a planarization film even if the surface of the semiconductor substrate 111 is uneven. Thus, bonding between the single crystal semiconductor substrate and the semiconductor substrate can be favorably performed.

Figure 6:
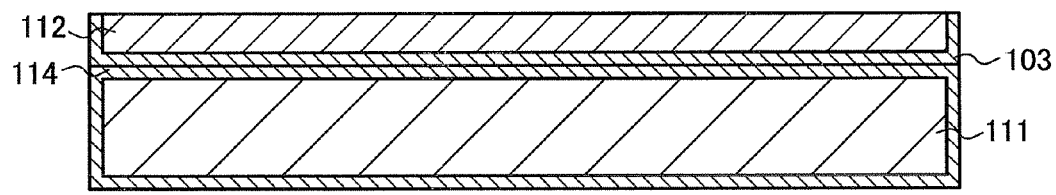
FIG. 6 is a view illustrating an example of a structure of an SOI substrate.

FIG. 6 illustrates a structure in which the single crystal semiconductor layer 112 is formed on the semiconductor substrate 111 with an oxide film 114 and the oxide film 103 interposed therebetween. Similarly to the oxide film 103, the oxide film 114 can be formed in such a manner that thermal oxidation treatment is performed on the semiconductor substrate 111. Although thermal oxidation treatment may be performed by dry oxidation, oxidation in an oxidizing atmosphere to which halogen is added is preferably performed. As a gas for adding halogen to an oxidizing atmosphere, one or plural kinds of gases selected from HCl, HF, NF$_3$, HBr, Cl$_2$, DCE (dichloroethylene), ClF$_3$, BCl$_3$, F$_2$, Br$_2$, and the like can be used. The thickness of the oxide film 114, which is formed, is 10 nm to 1000 nm (preferably 50 nm to 300 nm).

Impurities such as metal are gettered into the oxide film 114 which is formed on the surface of the semiconductor substrate 111 in the above-described manner due to the effect of halogen contained in the oxidizing atmosphere, so that the impurities such as metal in the semiconductor substrate 111 are removed or their concentration is decreased. In other words, due to the effect of halogen, the impurities such as metal become volatile halide and are diffused into the air, thereby being removed the single crystal semiconductor substrate 101. This is effective for the single crystal semiconductor substrate 101 whose surface is processed by CMP. Further, since the formation of the oxide film 114 by thermal oxidation treatment is performed at a temperature ranging from 900° C. to 1150° C., the crystallinity of the single crystal semiconductor substrate 101 is improved.

After the oxide film 114 is formed on the surface of the semiconductor substrate 111, the semiconductor substrate 111 and the single crystal semiconductor substrate 101 in which the oxide film 103 is formed on the surface and the embrittled region 104 is formed in a region at a predetermined depth from the surface (FIGS. 1A to 1E) are bonded to each other with the oxide film 114 and the oxide film 103 interposed therebetween. Next, heat treatment is performed to cause separation at the embrittled region 104, so that the single crystal semiconductor layer 112 can be formed over the semiconductor substrate 111 with the oxide film 114 and the oxide film 103 interposed therebetween. Note that planarization treatment may be performed on the single crystal semiconductor layer 112. The methods illustrated in FIGS. 1F to 1H may be used as methods of the above-described steps; therefore, detailed descriptions thereof are omitted. Through the above-described steps, an SOI substrate illustrated in FIG. 6 can be manufactured.

The oxide films are formed on the surfaces of the single crystal semiconductor substrate 101 and the semiconductor substrate 111 by thermal oxidation treatment, so that the oxide films function as a blocking layer which prevents impurities from diffusing from the semiconductor substrate 111 into the single crystal semiconductor layer 112 and contaminating the single crystal semiconductor layer 112. Further, since the oxide film obtained by thermal oxidation treatment is smooth, bonding between the single crystal semiconductor substrate and the semiconductor substrate can be favorably performed.

Figure 7:
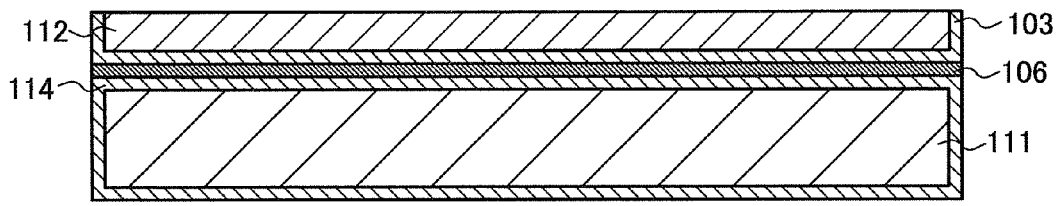
FIG. 7 is a view illustrating an example of a structure of an SOI substrate.

FIG. 7 illustrates a structure in which the single crystal semiconductor layer 112 is provided over the semiconductor substrate 111 with the oxide film 114, the insulating film 106, and the oxide film 103 interposed therebetween. The oxide film 114 and the insulating film 106 can be formed by the above-described method. Note that the insulating film 106 can be provided for one or both of the single crystal semiconductor substrate 101 and the semiconductor substrate 111.

After the oxide film 114 is formed on the semiconductor substrate 111 and the insulating film 106 is formed over the oxide film 114, the semiconductor substrate 111 and the single crystal semiconductor substrate 101 in which oxide film 103 is formed in a similar manner to the step illustrated in FIG. 1D and the embrittled region 104 is formed are bonded to each other. Through similar steps to those illustrated in FIGS. 1G and 1H, an SOI substrate illustrated in FIG. 7 can be manufactured.

The oxide films are formed on the surfaces of the single crystal semiconductor substrate 101 and the semiconductor substrate 111 by thermal oxidation treatment and the insulating film 106 is further formed, so that the oxide films and the insulating film 106 function as a blocking layer which prevents impurities from diffusing from the semiconductor substrate 111 into the single crystal semiconductor layer 112 and contaminating the single crystal semiconductor layer 112. Further, since an oxide film obtained by thermal oxidation treatment is smooth, the smoothness of the insulating film 106 can also be improved when the insulating film 106 is formed over the oxide film. Thus, bonding between the single crystal semiconductor substrate and the semiconductor substrate can be favorably performed.

Although the case where the thermal oxidation treatment is performed in an oxidizing atmosphere containing hydrogen chloride or dichloroethylene is described as the method for forming the oxide film 114 containing chlorine atoms in this embodiment, the present invention is not limited thereto. For example, after thermal oxidation treatment is performed on the semiconductor substrate 111 in an oxidizing atmosphere to form the oxide film 114 (e.g., SiOx) on the surface of the semiconductor substrate 111, chlorine atoms may be contained in the oxide film 114 by addition of chlorine ions accelerated by an electric field with use of an ion doping apparatus or an ion implantation apparatus. Alternatively, the thermal oxidation treatment may be performed in an oxidizing atmosphere after the surface is processed with a hydrogen chloride (HCl) solution.

This embodiment can be implemented in free combination with another embodiment.

An ion irradiation method, which is one feature of the present invention, is considered below.

In one embodiment of the present invention, a single crystal semiconductor substrate is irradiated with ions which are derived from hydrogen (H) (hereinafter, such ions are referred to as "hydrogen ion species"). More specifically, a hydrogen gas or a gas containing hydrogen in its composition is used as a source material, hydrogen plasma is generated, and the single crystal semiconductor substrate is irradiated with the hydrogen ion species in the hydrogen plasma.

(Ions in Hydrogen Plasma)

Hydrogen ion species such as $H^+$, $H_2^+$, and $H_3^+$ exist in the above-described hydrogen plasma. Here, reaction equations for reaction processes (generation processes and distribution processes) of the hydrogen ion species are listed below.

$$e + H \rightarrow e + H^+ + e \tag{1}$$

$$e + H_2 \rightarrow e + H_2^+ + e \tag{2}$$

$$e + H_2 \rightarrow e + (H_2)^* \rightarrow e + H + H \tag{3}$$

$$e + H_2^+ \rightarrow e + (H_2^+)^* \rightarrow e + H^+ + H \quad (4)$$

$$H_2^+ + H_2 \rightarrow H_3^+ H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 8:
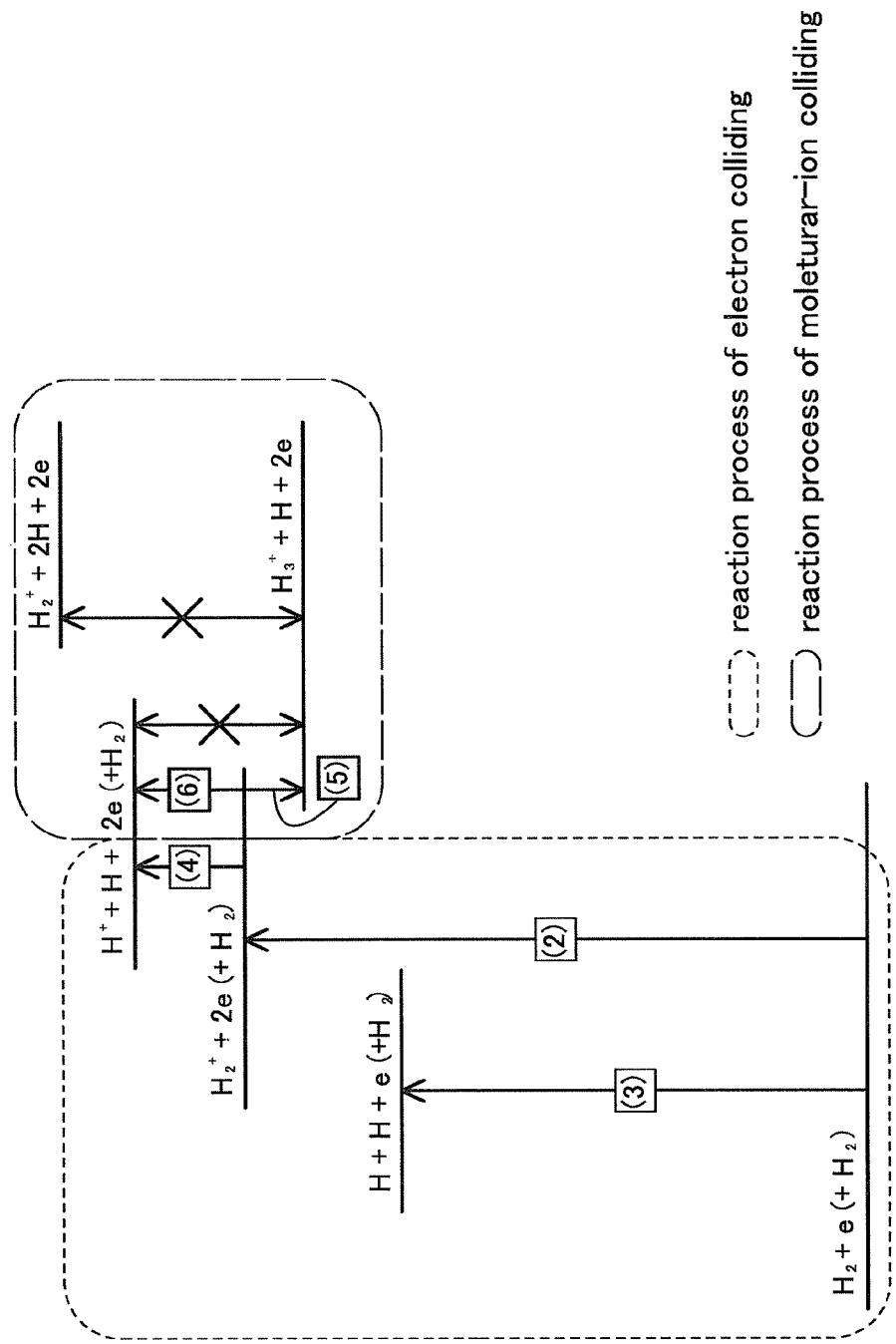
FIG. 8 is an energy diagram of hydrogen ion species.

FIG. 8 is an energy diagram which schematically illustrates some of the above-described reactions. Note that the energy diagram in FIG. 8 is merely a schematic energy diagram and does not exactly depict the relationships of energies of the reactions. Note that the reaction equations below are indicated by X in FIG. 8 because they are not experimentally observed.

$$H_2 + H^+ \rightarrow H_3^+ \quad (10)$$

$$H_2^+ + H \rightarrow H_3^+ \quad (11)$$

(Generation Process of H3+)

As described above, $H_3^+$ are mainly generated through the reaction process represented by the reaction equation (5). On the other hand, as a reaction which competes with the reaction equation (5), there is the reaction process represented by the reaction equation (6). For the amount of $H_3^+$ to be increase, at the least, it is necessary that the reaction of the reaction equation (5) occur more often than the reaction of the reaction equation (6) (note that, since there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

Force is exerted on a charged particle by an electric field, and the charged particle gains kinetic energy. The kinetic energy corresponds to the amount of decrease in potential energy due to an electric field. For example, the amount of kinetic energy that a given charged particle gains before colliding with another particle is equal to the difference between a potential energy at a potential before the charged particle moves and a potential energy at a potential before the collision. That is, in a situation where a charged particle can transfer a long distance in an electric field without colliding with another particle, the kinetic energy (or the average thereof) of the charged particle tends to be higher than that in a situation where the charged particle cannot. Such a tendency toward increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in the situation where the electric field is low, the amount of $H_3^+$ tends to be increased.

(Difference Depending on Ion Source)

Figure 9:
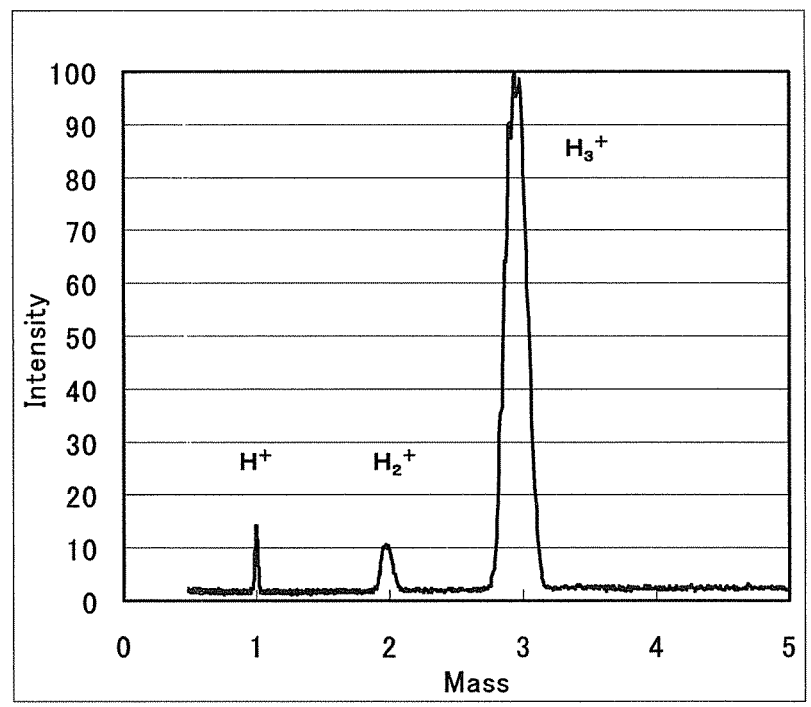
FIG. 9 is a diagram showing the results of ion mass spectrometry.

Here, an example in which the proportions of ion species (particularly, the proportion of $H_3^+$) are different is described. FIG. 9 is a graph showing the results of mass spectrometry of ions which are generated from a 100% hydrogen gas (with the pressure of an ion source of $4.7 \times 10^{-2}$ Pa). Note that this mass spectrometry was performed by measurement of ions which were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of a spectrum, which corresponds to the number of ions. In FIG. 9, the number of ions with different masses is expressed as a relative proportion where the number of ions with a mass of 3 is defined as 100. It can be seen from FIG. 9 that the ratio between ion species which are generated from the ion source, i.e., the ratio between $H^+$, $H_2^+$, and $H_3^+$, is approximately 1:1:8. Note that ions at such a ratio can also be generated by an ion doping apparatus which includes a plasma source portion (ion source) which generates plasma, an extraction electrode which extracts an ion beam from the plasma, and the like.

Figure 10:
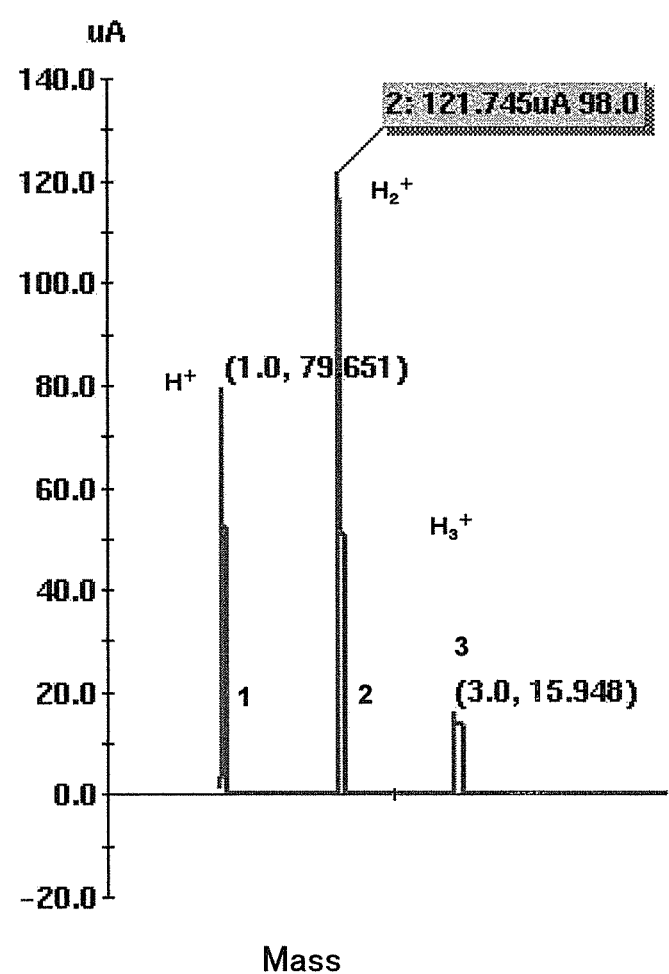
FIG. 10 is a diagram showing the results of ion mass spectrometry.

FIG. 10 is a graph showing the results of mass spectrometry of ions which are generated from $PH_3$ when an ion source different from that for the case of FIG. 9 is used and the pressure of the ion source is about $3 \times 10^{-3}$ Pa. The results of this mass spectrometry focus on the hydrogen ion species. In addition, the mass spectrometry was performed by measurement of ions which were extracted from the ion source. As in FIG. 9, the horizontal axis of FIG. 10 represents ion mass, and the mass 1 peak, the mass 2 peak, and the mass 3 peak correspond to $H^+$, $H_2^+$, and $H_3^+$, respectively. The vertical axis represents the intensity of a spectrum, which corresponds to the number of ions. It can be seen from FIG. 10 that the ratio between ion species in plasma, i.e., the ratio between $H^+$, $H_2^+$, and $H_3^+$, is about 37:56:7. Note that, although FIG. 10 shows the data obtained when the source gas is PH$_3$, the ratio between the hydrogen ion species is substantially the same when a 100% hydrogen gas is used as a source gas, as well.

In the case of the ion source from which the data shown in FIG. 10 is obtained, H$_3^+$, of H$^+$, H$_2^+$, and H$_3^+$, is generated at a proportion of only about 7%. On the other hand, in the case of the ion source from which the data shown in FIG. 9 is obtained, the proportion of H$_3^+$ ions can be up to 50% or higher (under the above-described conditions, about 80%). This is thought to result from the pressure and electric field inside a chamber, which is clearly shown in the above consideration.

(H$_3^+$ Irradiation Mechanism)

In the case where plasma which contains a plurality of ion species as shown in FIG. 9 is generated and a single crystal semiconductor substrate is irradiated with the generated ion species without any mass separation being performed, the surface of the single crystal semiconductor substrate is irradiated with each of H$^+$, H$_2^+$, and H$_3^+$ ions. In order to reproduce the mechanism, from the irradiation with ions to the formation of an ion-introduced region, the following five types of models are considered.

Model 1, where the ion species used for irradiation is H$^+$, which is still H$^+$ (H) after the irradiation.
Model 2, where the ion species used for irradiation is H$_2^+$, which is still H$_2^+$ (H$_2$) after the irradiation.
Model 3, where the ion species used for irradiation is H$_2^+$, which splits into two H atoms (H$^+$ ions) after the irradiation.
Model 4, where the ion species used for irradiation is H$_3^+$, which is still H$_3^+$ (H$_3$) after the irradiation.
Model 5, where the ion species used for irradiation is H$_3^+$, which splits into three H atoms (H$^+$ ions) after the irradiation.

(Comparison of Simulation Results with Measured Values)

Based on the above models, irradiation of a Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the H$_2^+$ replaced by H$^+$ which has twice the mass. In addition, a calculation based on Model 4 was performed with the H$_3^+$ replaced by H$^+$ which has three times the mass. Furthermore, a calculation based on Model 3 was performed with the H$_2^+$ replaced by H$^+$ which has half the kinetic energy, and a calculation based on Model 5, with the H3$^+$ replaced by H$^+$ which has one-third the kinetic energy.

Note that SRIM is software intended for amorphous structures, but SRIM can be applied to cases where irradiation with the hydrogen ion species is performed with high energy at a high dose. This is because the crystal structure of a Si substrate changes into a non-single-crystal structure due to the collision of the hydrogen ion species and Si atoms.

Figure 11:
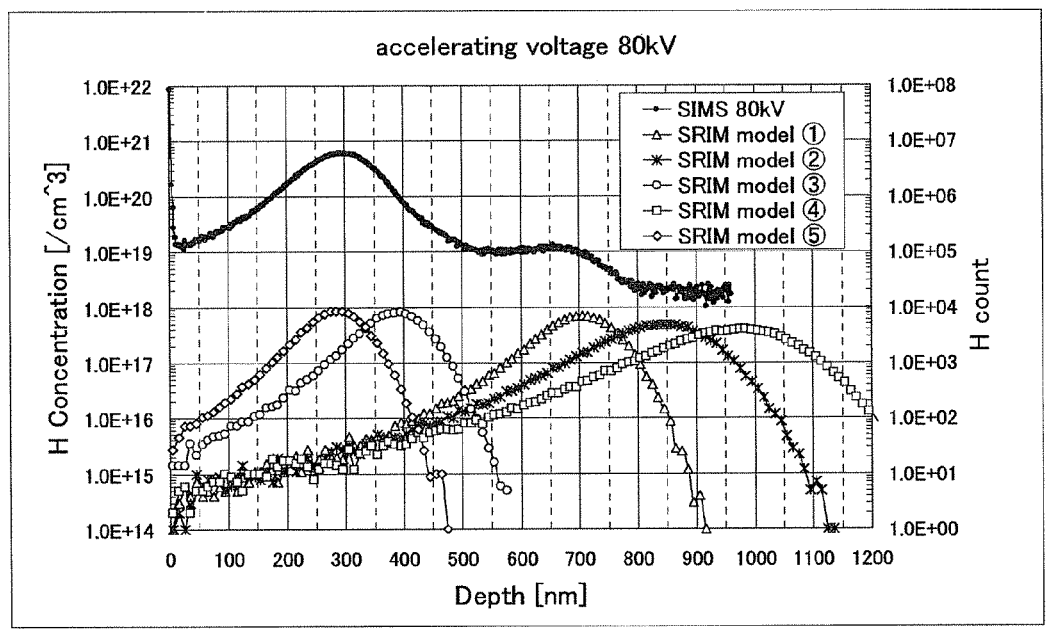
FIG. 11 is a graph showing the profile (measured values and calculated values) of hydrogen atoms in the depth direction when the accelerating voltage is 80 kV.

FIG. 11 shows the calculation results of the number of hydrogen atoms in a Si substrate obtained in the case where the Si substrate is irradiated with hydrogen ion species (at the time of irradiation with 100,000 atoms for H) with use of Models 1 to 5. FIG. 11 also shows the hydrogen concentration (secondary ion mass spectrometry (SIMS) data) in a Si substrate irradiated with the hydrogen ion species of FIG. 9. The results of calculations performed with use of Models 1 to 5 are expressed on the vertical axis (right axis) as the number of hydrogen atoms, and the SIMS data is expressed on the vertical axis (left axis) as the density of hydrogen atoms. The horizontal axis represents the depth from the surface of a Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on several kiloelectron volts whereas the H—H bond energy is only approximately several electron volts, it is thought that the contribution of each of Models 2 and 4 is small because H$_2^+$ and H$_3^+$ mostly split into H$^+$ or H by colliding with Si atoms.

Figure 12:
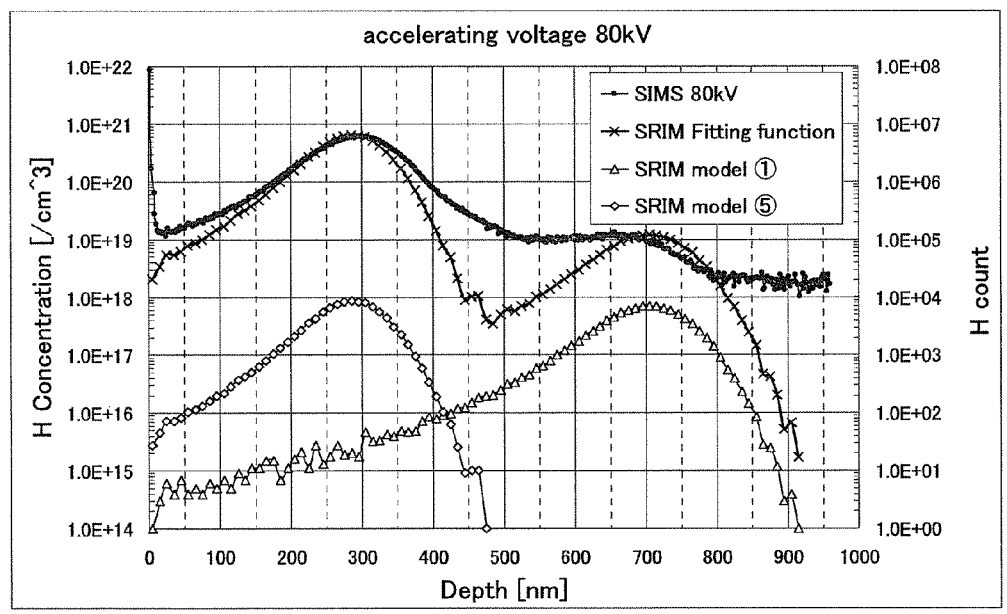
FIG. 12 is a graph showing the profile (measured values, calculated values, and fitting functions) of hydrogen atoms in the depth direction when the accelerating voltage is 80 kV.
Figure 13:
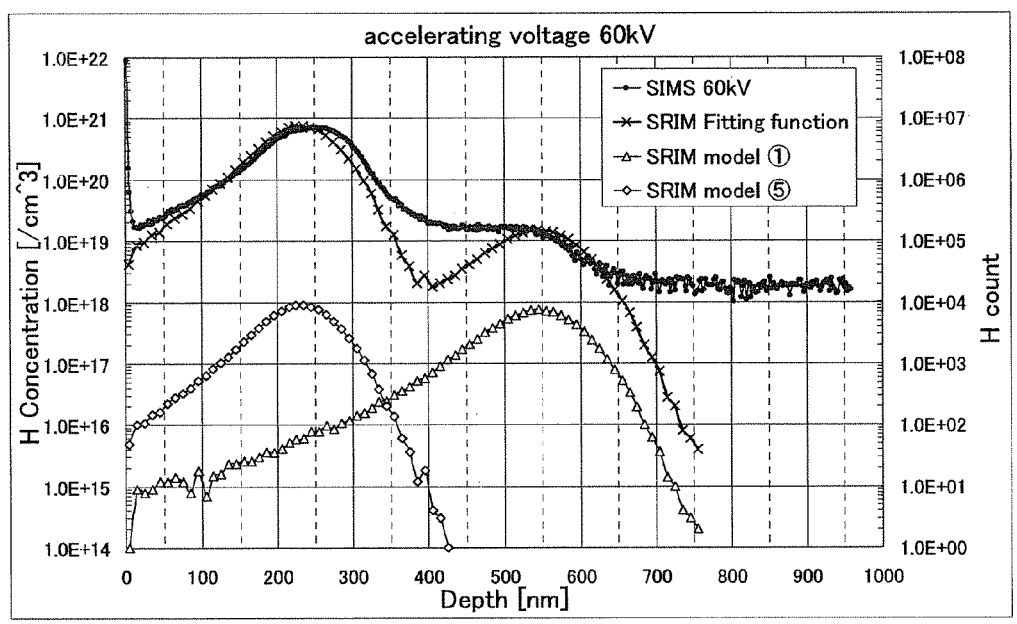
FIG. 13 is a graph showing the profile (measured values, calculated values, and fitting functions) of hydrogen atoms in the depth direction when the accelerating voltage is 60 kV.
Figure 14:
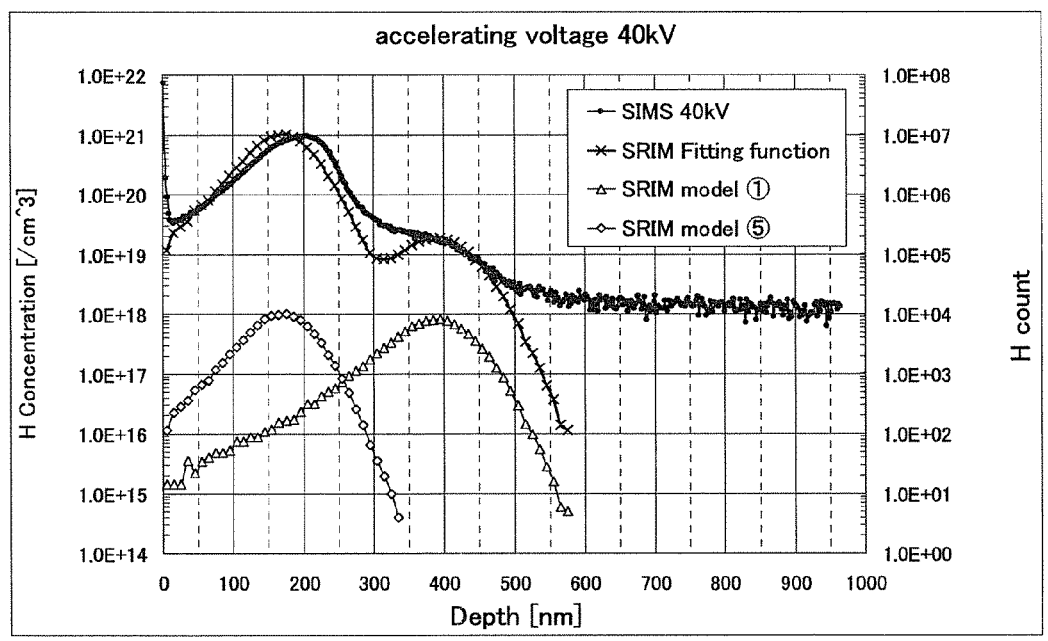
FIG. 14 is a graph showing the profile (measured values, calculated values, and fitting functions) of hydrogen atoms in the depth direction when the accelerating voltage is 40 kV.

Accordingly, Models 2 to 4 will not be considered hereinafter. FIG. 12, FIG. 13, and FIG. 14 each show the calculation results obtained in the case where irradiation with the hydrogen ion species (irradiation with 100,000 atoms for H) is performed with use of Models 1 and 5. FIG. 12, FIG. 13, and FIG. 14 also each show the hydrogen concentration (SIMS data) in a Si substrate irradiated with the hydrogen ion species of FIG. 9 and the simulation results fitted to the SIMS data (hereinafter referred to as a "fitting function"). Here, FIG. 12 shows the case where the accelerating voltage is 80 kV, FIG. 13, the case where the accelerating voltage is 60 kV; and FIG. 14, the case where the accelerating voltage is 40 kV. Note that the results of calculations performed with use of Models 1 and 5 are expressed on the vertical axis (right axis) as the number of hydrogen atoms, and the SIMS data and the fitting function are expressed on the vertical axis (left axis) as the density of hydrogen atoms. The horizontal axis represents the depth from the surface of a Si substrate.

The fitting function is obtained using the calculation formula given below, in consideration of Models 1 and 5. Note that, in the calculation formula, X and Y represent fitting parameters and V represents volume.

$$[\text{Fitting Function}] = X/V \times [\text{Data of Model 1}] + Y/V \times [\text{Data of Model 5}]$$

In consideration of the ratio between ion species used for actual irradiation (H$^+$:H$_2^+$:H$_3^+$ is about 1:1:8), the contribution of H$_2^+$ (i.e., Model 3) should also be considered; however, Model 3 is excluded from the consideration given here for the following reasons.

1. Since the amount of hydrogen introduced through the irradiation process of Model 3 is small compared with that added through the irradiation process of Model 5, there is no significant influence even if Model 3 is excluded from the consideration (no peak appears in the SIMS data either).
2. Model 3, the peak position of which is close to that of Model 5, is likely to be obscured by channeling (movement of atoms due to crystal lattice structure) which occurs in Model 5.
That is, it is difficult to estimate fitting parameters for Model 3. This is because this simulation assumes amorphous Si and the influence due to crystallinity is not considered.

FIG. 15 lists the above fitting parameters. At any of the accelerating voltages, the ratio of the amount of H introduced according to Model 1 to that introduced according to Model 5 is approximately 1:42 to 1:45 (the amount of H in Model 5, when the amount of H in Model 1 is defined as 1, is approximately greater than or equal to 42 and less than or equal to 45), and the ratio of the number of ions used for irradiation, H$^+$ (Model 1) to that of H$_3^+$ (Model 5) is approximately 1:14 to 1:15 (the amount of H$_3^+$ in Model 5, when the amount of H$^+$ in Model 1 is defined as 1, is approximately 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 9. For example, since $H_3^+$ splits into $H^+$, H, and the like to be introduced into a substrate, ion introduction efficiency can be improved compared with the case of irradiation mainly with $H^+$ or $H_2^+$. This leads to improvement in productivity of semiconductor substrates. In addition, since the kinetic energy of $H^+$ or H after $H_3^+$ similarly splits tends to be low, $H_3^+$ is suitable for manufacture of thin semiconductor layers.

Note that, in this specification, a method is described in which an ion doping apparatus which is capable of irradiation with the hydrogen ion species as shown in FIG. 9 is used in order to efficiently perform irradiation with $H_3^+$. Ion doping apparatuses are inexpensive and excellent for use in treatment of a large area. Therefore, by irradiation with $H_3^+$ using such an ion doping apparatus, significant effects such as improvement in semiconductor characteristics, increase in area, reduction in costs, and increase in productivity can be obtained. On the other hand, if first priority is given to irradiation with $H_3^+$, there is no need to construe the present invention as being limited to the use of an ion doping apparatus.

(Embodiment 2)

In this embodiment, a method for manufacturing an SOI substrate which is different from that in the above embodiment will be described with reference to drawings. Specifically, a case of using a single crystal semiconductor substrate whose corners (edges) are rounded (having edge roll-off (ERO)) will be described. In addition, a case of repeatedly using (reusing) a single crystal semiconductor substrate will be described with reference to drawings. Note that, in this embodiment, elements similar to those in the above embodiment are indicated by the same reference numerals, and detailed descriptions thereof are omitted.

Figure 16A:
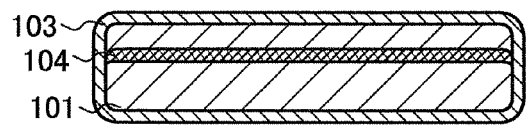
FIGS. 16A to 16J are views illustrating an example of a method for manufacturing an SOI substrate.

First, the single crystal semiconductor substrate 101 (here, a single crystal silicon substrate) whose surface is provided with the oxide film 103 and in which the embrittled region 104 is formed in a region at a predetermined depth from the surface is prepared (FIG. 16A). The methods illustrated in FIGS. 1A to 1E may be used as methods of FIG. 16A; therefore, detailed descriptions thereof are omitted.

In this embodiment, as illustrated in FIG. 16A, the corners (edges) of the single crystal semiconductor substrate 101 are rounded; thus, the oxide film 103 is formed on the surfaces of the edges.

Figure 16B:
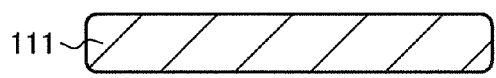
Figure 16C:
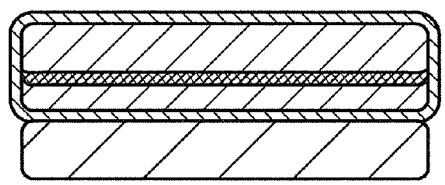

Next, the semiconductor substrate 111 is prepared (FIG. 16B), and bonding is performed so that the oxide film 103 and one of surfaces of the semiconductor substrate 111 face each other (FIG. 16C).

Figure 16D:
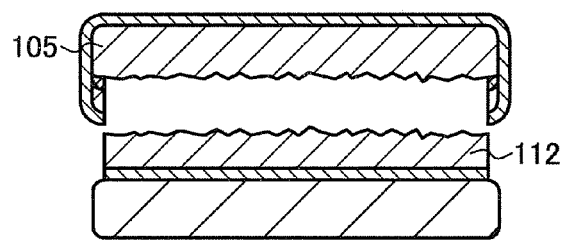

Next, heat treatment is performed to cause separation at the embrittled region 104, so that the single crystal semiconductor layer 112 is formed over the semiconductor substrate 111 with the oxide film 103 interposed therebetween (FIG. 16D).

Figure 16F:
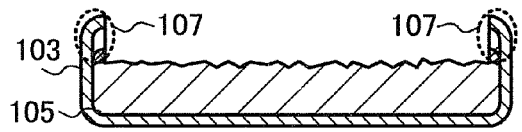
Figure 16E:
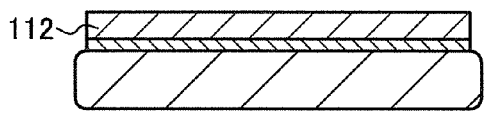

Through the above-described steps, the single crystal semiconductor layer 112 can be formed over the semiconductor substrate 111 with the oxide film 103 interposed therebetween (FIG. 16E). Note that, in the case where the surface of the single crystal semiconductor layer 112 is uneven, planarization treatment is preferably performed on the surface before a device is formed using the SOI substrate. In a similar manner to the planarization treatment of FIG. 1H, planarization treatment can be performed by one or a combination of plural methods of CMP, etching treatment, and laser light irradiation. The planarization treatment makes it possible to reduce crystal defects in and on the surface of the single crystal semiconductor layer 112 and recover the crystallinity.

The methods described in above Embodiment 1 may be used as methods of FIGS. 16A to 16E; therefore, detailed descriptions thereof are omitted.

Next, a step of repeatedly using the single crystal semiconductor substrate 105 which is obtained after the separation (semiconductor substrate reprocessing treatment) will be described.

In some cases, bonding between the single crystal semiconductor substrate 101 and the semiconductor substrate 111 is not performed sufficiently at the edges of the single crystal semiconductor substrate 101 due to the edge roll-off. As a result, the edges of the single crystal semiconductor substrate 105 are not separated at the edges of the embrittled region 104, and the oxide film 103 and the like remain in some cases (FIG. 16F).

Figure 16G:
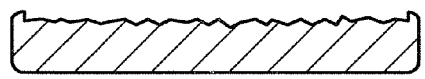

Therefore, residues 107 at the edges of the single crystal semiconductor substrate 105 are removed (FIG. 16G). The residues 107 can be removed by wet etching treatment. Specially, wet etching is performed using a mixed solution of hydrofluoric acid, ammonium fluoride, and surfactant (e.g., product name: LAL500, manufactured by Stella Chemifa Corporation) as an etchant.

Further, the embrittled region 104 into which hydrogen ions are introduced can be removed by wet etching using an organic alkaline aqueous solution typified by tetramethyl-ammonium hydroxide (TMAH). By such treatment, steps due to the residues at the edges of the single crystal semiconductor substrate 105 are reduced.

Figure 16H:
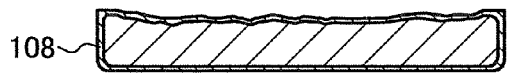

Next, the single crystal semiconductor substrate 105 is oxidized in a halogen atmosphere to form an oxide film 108 (FIG. 16H). After that, the oxide film 108 is removed. Hydrogen chloride (HCl) can be used as the halogen. The oxide film 108 is removed after being formed by the thermal oxidation treatment as described above; accordingly, a gettering effect by a halogen element can be obtained. As the gettering effect, an effect of removing impurities such as metal introduced at the time of manufacturing an SOI substrate can be obtained. In other words, due to the effect of chlorine, impurities such as metal become volatile halide (e.g., chloride) and are diffused into the air, thereby being removed.

Figure 16I:
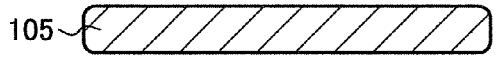
Figure 16J:
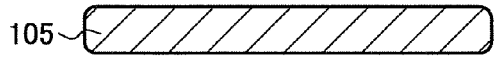
Figure 17A:
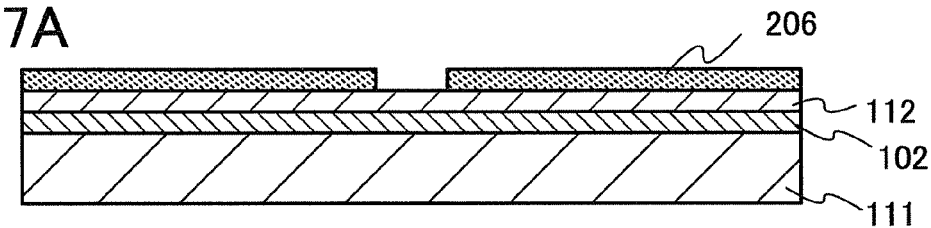
FIGS. 17A to 17E are cross-sectional views illustrating an example of a method for manufacturing a transistor.
Figure 17B:
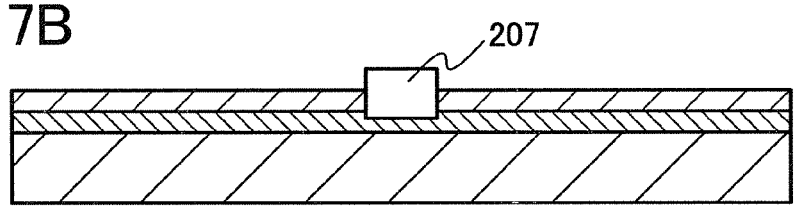
Figure 17C:
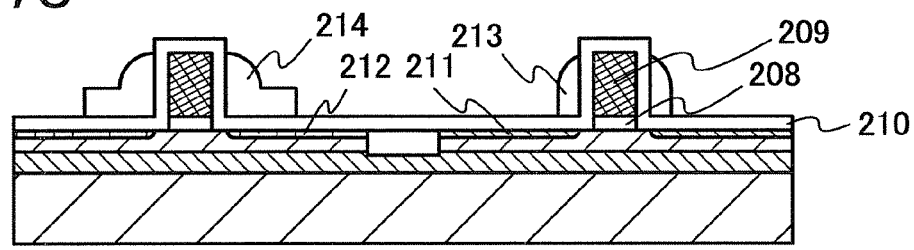
Figure 17D:
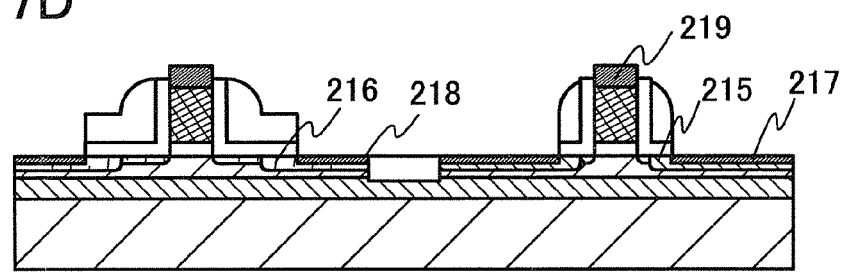
Figure 17E:
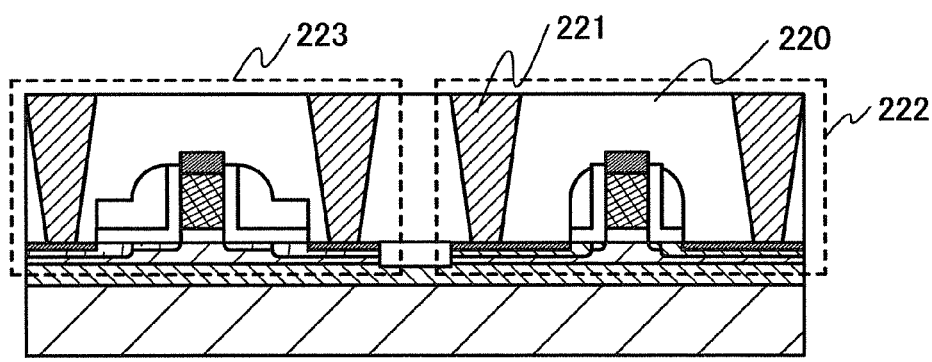

Then, planarization treatment is performed on the single crystal semiconductor substrate 105. For the planarization treatment, any one of or a combination of plural methods of CMP, dry etching treatment or wet etching treatment, and laser light irradiation can be performed. In this embodiment, the single crystal semiconductor substrate 105 is irradiated with laser light (FIG. 16I). The single crystal semiconductor substrate 105 is irradiated with laser light to be melted. A portion of the single crystal semiconductor substrate 105, which is melted by laser light irradiation, is cooled and solidified; thus, the planarity is improved. Laser light irradiation enables reduction in crystal defects of the single crystal semiconductor substrate 105 and improvement in the crystallinity thereof as well as improvement in the planarity thereof (FIG. 16J).

A specific method of irradiating the single crystal semiconductor substrate 105 with laser light can be performed in a similar manner to the method illustrated in FIG. 1C; therefore, description thereof is omitted. Note that as separation of the single crystal semiconductor layer and reprocessing treatment are repeatedly performed on the single crystal semiconductor substrate 105, the thickness of the single crystal semiconductor substrate 105 is gradually reduced. Therefore, in the laser light irradiation step illustrated in FIG. 16I, CW laser light having a wavelength suitable for the thickness of the single crystal semiconductor substrate, i.e., a wavelength whose penetration length of light to the single crystal semiconductor substrate is substantially the same as the thickness of the single crystal semiconductor substrate is used as appropriate. When a laser which is capable of changing a wavelength is used, one laser can meet the thickness of the single crystal semiconductor substrate even if the thickness thereof is gradually reduced; thus, such a laser is efficient. Laser light irradiation is performed in such a manner that the wavelength of CW laser light is changed as appropriate in accordance with the thickness of the single crystal semiconductor substrate as described above, whereby the single crystal semiconductor substrate can be maximally reused.

In some cases, a step due to separation of the single crystal semiconductor layer 112 remains at the edge of the single crystal semiconductor substrate 105 even if the single crystal semiconductor substrate 105 is irradiated with laser light. In that case, planarization is preferably performed by CMP after the laser light irradiation. As a result, the step at the edge of the single crystal semiconductor substrate 105 can be removed and the surface of the single crystal semiconductor substrate 105 can be planarized. Note that the planarization step may be omitted if desired planarity is obtained by the laser light irradiation.

Through the above-described steps, the single crystal semiconductor substrate 105 of which crystal defects are reduced and crystallinity is high can be obtained. In order to manufacture an SOI substrate using the single crystal semiconductor substrate 105 on which reprocessing treatment has been performed, the manufacturing process of the SOI substrate can be performed from the step illustrated in FIG. 1D.

Such reprocessing treatment makes it possible to manufacture an SOT substrate whose crystal defects are reduced even in the case where the SOI substrate is manufactured using the single crystal semiconductor substrate 105. In addition, the single crystal semiconductor substrate is repeatedly used by reprocessing treatment thereof, whereby cost can be reduced. Moreover, since a reprocessed surface of the single crystal semiconductor substrate described in this embodiment can be sufficiently planarized, adhesiveness between the single crystal semiconductor substrate and the semiconductor substrate can be increased and bonding defects can be reduced.

This embodiment can be implemented in free combination with another embodiment.

(Embodiment 3)

In this embodiment, a method for manufacturing a semiconductor device using an SOI substrate manufactured in Embodiment 1 or 2 will be described. Here, an example of forming a CMOS structure as a semiconductor device will be described with reference to FIGS. 17A to 17E. Note that, in this embodiment, elements similar to those in the above embodiments are indicated by the same reference numerals, and detailed descriptions thereof are omitted.

According to Embodiment 1, the single crystal semiconductor layer 112 of an SOI substrate can have a thickness of 100 nm or smaller. When the single crystal semiconductor layer 112 has a thickness of 100 nm or smaller, it is thinner than the maximum depth of a depletion layer in a channel formation region of a transistor, and outstanding electrical characteristics of the transistor are brought about. The channel region of the transistor is depleted sufficiently, whereby favorable subthreshold value, threshold voltage, or the like can be obtained. Further, when a CMOS structure is formed, fast switching speed can be obtained.

First, an SOI substrate is obtained in accordance with Embodiment 1, and then a protective layer 206 which serves as a mask for forming an element isolation insulating layer is formed over the single crystal semiconductor layer 112. This step is illustrated in a process cross-sectional view of FIG. 17A. A silicon oxide film, a silicon nitride film, or the like is used as the protective layer 206.

Note that a p-type impurity such as boron, aluminum, or gallium is preferably added to the single crystal semiconductor layer 112 in order to control threshold voltage. For example, the single crystal semiconductor layer 112 may be doped with boron as a p-type impurity at a concentration of $5\times10^{17}$ cm$^{-3}$ to $1\times10^{18}$ cm$^{-3}$.

Next, etching is performed using the protective layer 206 as a mask to remove exposed part of the single crystal semiconductor layer 112 and part of the oxide film 103 thereunder. Then, a silicon oxide film is deposited by a chemical vapor deposition method using TEOS. This silicon oxide film is thickly deposited so that the single crystal semiconductor layer 112 is embedded. Then, after the silicon oxide film deposited over the single crystal semiconductor layer 112 is removed by polishing, the protective layer 206 is removed; thus, an element isolation insulating layer 207 is left. This step is illustrated in a process cross-sectional view of FIG. 17B.

Next, a first insulating film is formed, a gate electrode 209 having a polysilicon film containing a conductive material is formed over the first insulating film, and the first insulating film is etched using the gate electrode 209 as a mask to form a gate insulating layer 208. The gate insulating layer 208 is a single layer of a film containing silicon oxide, silicon nitride oxide, silicon nitride, hafnium oxide, aluminum oxide, or tantalum oxide obtained by a PECVD method, a sputtering method, or the like; or a stacked layer of those films. The gate insulating layer 208 can be formed to have a thin thickness of, for example, 20 nm to cover the surface of the single crystal semiconductor layer 112 by a PECVD method. Alternatively, the gate insulating layer 208 may be formed in such a manner that the surface of the single crystal semiconductor layer 112 is oxidized or nitrided by high-density plasma treatment. The high-density plasma treatment is performed using, for example, a mixed gas of a rare gas such as He, Ar, Kr, or Xe, and oxygen, nitrogen oxide, ammonia, nitrogen, hydrogen, or the like. In this case, when extraction of plasma is performed by a microwave, high-density plasma with a low electron temperature can be generated. The surface of the single crystal semiconductor layer 112 is oxidized or nitrided by oxygen radicals (OH radicals may be included) or nitrogen radicals (NH radicals may be included) which are generated by such high-density plasma, whereby an insulating film is formed to a thickness of 1 nm to 50 nm, desirably 5 nm to 30 nm, so as to be in contact with the single crystal semiconductor layer 112. As described in Embodiment 1, the surface of the single crystal semiconductor layer is sufficiently planarized by planarization treatment; thus, sufficient gate withstand voltage can be obtained even if an insulating film with a thickness of 20 nm is used as the gate insulating layer 208. This step is illustrated in a process cross-sectional view of FIG. 17C.

Next, a second insulating film 210 which covers the gate electrode 209 is formed; a region to be an nFET is doped with arsenic (As) or the like to form a first impurity region 211 with a shallow junction depth; and a region to be a pFET is doped with boron (B) or the like to form a second impurity region 212 with a shallow junction depth. Moreover, sidewall insulating layers 213 and 214 are formed. The width of the sidewall insulating layer 214 of the region to be a pFET is larger than that of the sidewall insulating layer 213 of the region to be an nFET. This step is illustrated in a process cross-sectional view of FIG. 17C.

Next, the second insulating film 210 is partially etched to expose a top surface of the gate electrode 209, the first impurity region 211, and the second impurity region 212. Then, a region to be an nFET is doped with As or the like to form a third impurity region 215 with a deep junction depth, and a region to be a pFET is doped with B or the like to form a fourth impurity region 216 with a deep junction depth. Then, heat treatment for activation (800° C. to 1100° C.) is performed. Next, a cobalt film is formed as a metal film for forming a silicide. Then, heat treatment such as RTA (at 500° C. for one minute) is performed to form a silicide from silicon of a part in contact with the cobalt film. After that, the cobalt film is selectively removed to form silicides 217, 218, and 219. Then, heat treatment is performed at a temperature higher than the heat treatment for forming the silicide to reduce the resistance of the silicide portions. This step is illustrated in a process cross-sectional view of FIG. 17D.

Next, an interlayer insulating film 220 is formed, and contact plugs 221 reaching the third impurity region 215 with a deep junction depth and the fourth impurity region 216 with a deep junction depth are formed. Thus, an nFET 222 and a pFET 223 can be manufactured using the single crystal semiconductor layer 112 bonded to the semiconductor substrate 111. This step is illustrated in a process cross-sectional view of FIG. 17E.

The nFET 222 and the pFET 223 are complementarily combined to form a CMOS structure.

Through the above-described steps, transistors can be manufactured using an SOI substrate according to one embodiment of the present invention. The single crystal semiconductor layer of the SOI substrate according to one embodiment of the present invention has few crystal defects and a planarized surface and is thinned to a thickness of less than or equal to 50 nm. Accordingly, transistors with excellent characteristics such as low driving voltage, high electron field effect mobility, and a low subthreshold value can be manufactured over the SOI substrate. Furthermore, a plurality of high performance transistors with little variation in characteristics between the transistors can be formed over the same substrate. In other words, with use of the SOI substrate according to one embodiment of the present invention, nonuniformity of the important characteristic value as transistor characteristics, such as threshold voltage or mobility, can be suppressed, and higher performance is possible. Note that in this embodiment, the description is made with use of the SOI substrate having a structure in which the oxide film 103 and the single crystal semiconductor layer 112 are formed over the semiconductor substrate 111 in this order; however, the present invention is not construed as being limited thereto.

(Embodiment 4)

In this embodiment, an example of a method for manufacturing a semiconductor device having a high performance and highly reliable semiconductor element with high yield, which is different from the method described in Embodiment 3 will be described. Note that in a method for manufacturing a semiconductor device described in this embodiment, an opening for connecting a semiconductor layer and a wiring is formed in a self-aligned manner. Note that in this embodiment, elements similar to those in the above embodiments are indicated by the same reference numerals, and detailed descriptions thereof are omitted.

First, an SOI substrate manufactured by the method described in Embodiment 1 or the like is prepared. In this embodiment, description will be made with use of an SOI substrate having a structure in which the oxide film 114, the oxide film 103, and the single crystal semiconductor layer 112 are formed in this order over the semiconductor substrate 111. After the semiconductor layer over the semiconductor substrate is patterned into an island shape to form an island-shaped semiconductor layer 606, an insulating layer 608 serving as a gate insulating layer and a conductive layer serving as a gate electrode (or a wiring) are formed in this order. In this embodiment, the conductive layer serving as a gate electrode has a two-layer structure; however, the present invention is not limited thereto. Here, the insulating layer 608 can be formed using a material such as silicon oxide, silicon oxynitride, silicon nitride oxide, or silicon nitride by a CVD method, a sputtering method, or the like. The thickness of the insulating layer 608 may be greater than or equal to about 5 nm and less than or equal to about 100 nm. The conductive layer can be formed using a material such as tantalum (Ta), tungsten (W), titanium (Ti), molybdenum (Mo), aluminum (Al), copper (Cu), chromium (Cr), or niobium (Nb) by a CVD method, a sputtering method, or the like. The thickness of the conductive layer may be greater than or equal to about 100 nm and less than or equal to about 500 nm. Note that in this embodiment, a case is described in which the insulating layer 608 is formed using silicon oxide (thickness: 20 nm), the conductive layer (a lower layer) is formed using tantalum nitride (thickness: 50 nm), and the conductive layer (an upper layer) is formed using tungsten (thickness: 200 nm).

Note that an impurity element imparting p-type conductivity such as boron, aluminum, or gallium or an impurity element imparting n-type conductivity such as phosphorus or arsenic may be added to the semiconductor layer in order to control a threshold voltage of a transistor. For example, in the case of adding boron as an impurity element imparting p-type conductivity, boron may be added at a concentration of greater than or equal to $5 \times 10^{16}$ cm$^{-3}$ and less than or equal to $1 \times 10^{17}$ cm$^{-3}$. Further, hydrogenation treatment may be performed on the semiconductor layer. The hydrogenation treatment is performed, for example, at 350° C. in a hydrogen atmosphere for about two hours.

Next, the conductive layer serving as a gate electrode is patterned. Note that in a method for manufacturing a thin film transistor in this embodiment, patterning is performed on the conductive layer at least twice. Here, first patterning is performed. As a result of the first patterning, a conductive layer 610 and a conductive layer 612 which are larger than a gate electrode which is to be formed finally are formed. The term "larger" here means a size with which a resist mask for forming the gate electrode in second patterning can be formed in accordance with the position of the conductive layer 610 and the conductive layer 612. Note that the first patterning and the second patterning may be performed on a region of the conductive layer overlapping with the island-shape semiconductor layer 606 and the first patterning and the second patterning do not need to be performed on an entire surface of the conductive layer.

Figure 18A:
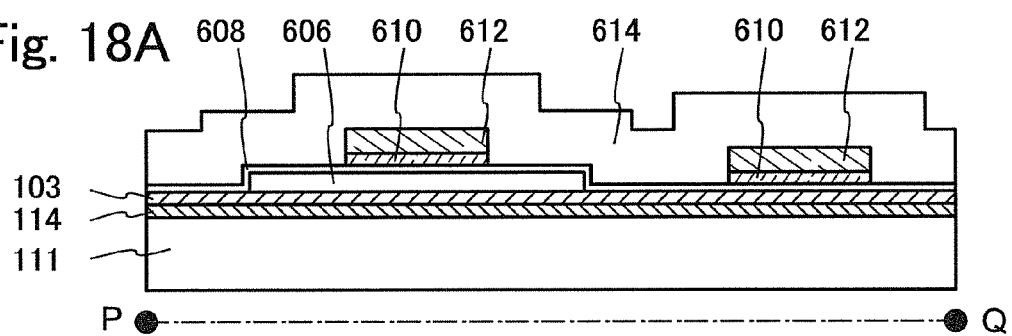
FIGS. 18A to 18D are cross-sectional views illustrating an example of a method for manufacturing a transistor.
Figure 20A:
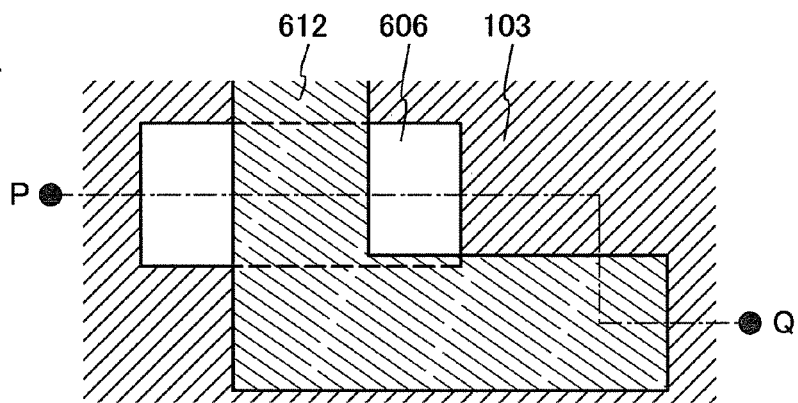
FIGS. 20A to 20D are plan views illustrating an example of a method for manufacturing a transistor.

After that, an insulating layer 614 is formed so as to cover the insulating layer 608, the conductive layer 610, and the conductive layer 612 (see FIG. 18A and FIG. 20A). Here, the insulating layer 614 can be formed using a material such as silicon oxide, silicon oxynitride, silicon nitride oxide, silicon nitride, hafnium oxide, or aluminum oxide by a CVD method, a sputtering method, or the like. The thickness of the insulating layer 614 is preferably greater than or equal to about 0.5 μm and less than or equal to about 2 μm. In this embodiment, as an example, a case is described in which the insulating layer 614 is formed using silicon oxide (thickness: 1 μm).

Figure 18B:
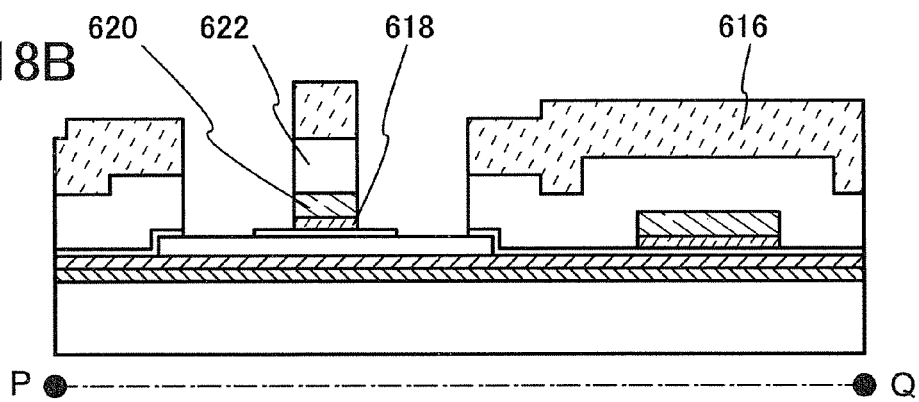
Figure 18C:
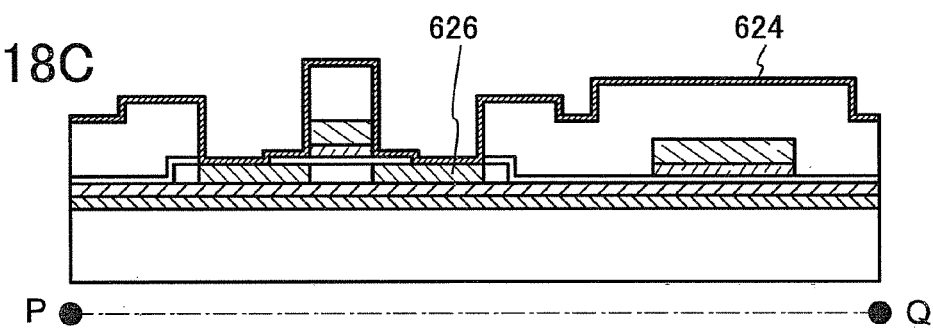
Figure 18D:
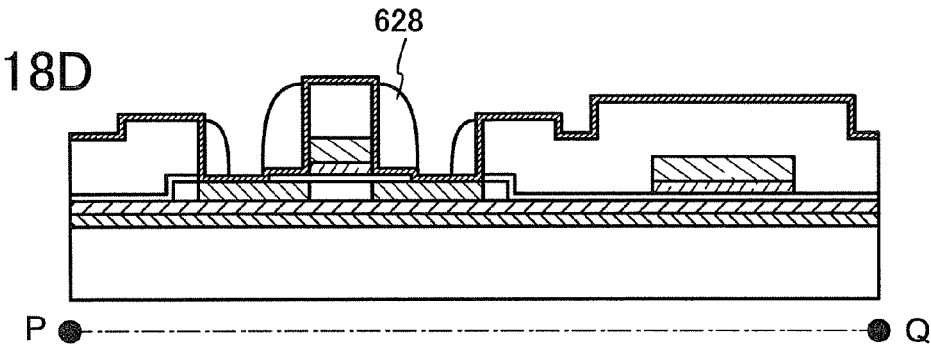
Figure 19C:
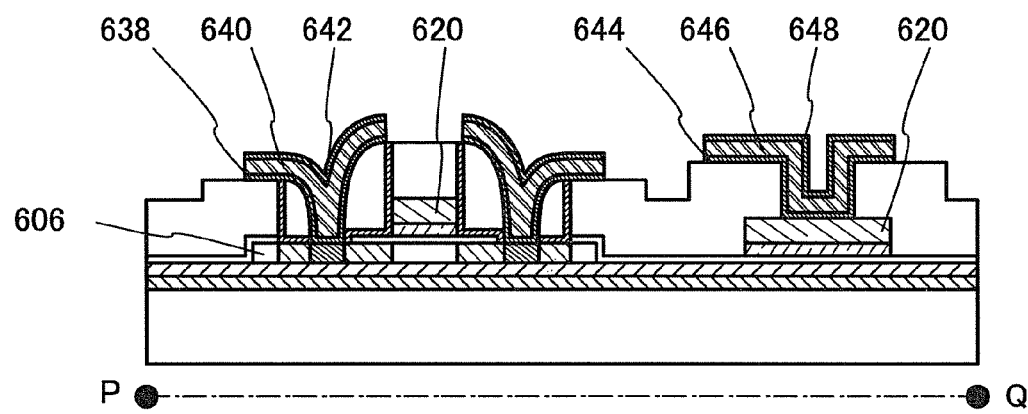
Figure 20B:
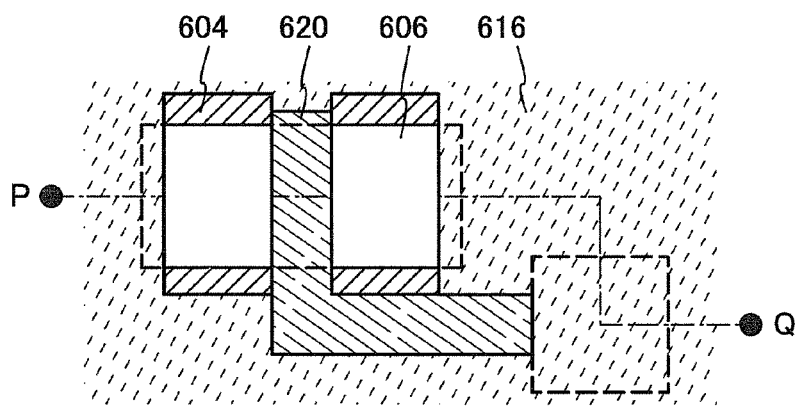

Note that FIG. 18A is a view corresponding to a cross section taken along the line P-Q of FIG. 20A which is a plane view. Similarly, FIG. 18B, FIG. 18D, and FIG. 19C are views corresponding to cross sections taken along the lines P-Q of FIG. 20B, FIG. 20C and FIG. 20D, respectively. In the plane views illustrated in FIG. 20A to 20D, some components in the corresponding cross-sectional views are omitted for simplicity.

Next, a resist mask 616 for forming a gate electrode, which is used for patterning, is formed over the insulating layer 614. The patterning corresponds to the second patterning of the first patterning and the second patterning which are performed on the conductive layer. The resist mask 616 can be formed in such a manner that a resist material which is a photosensitive substance is applied, and then a pattern is exposed to light. After the resist mask 616 is formed, the conductive layer 610, the conductive layer 612, and the insulating layer 614 are patterned with use of the resist mask 616. Specifically, the insulating layer 614 is selectively etched to form an insulating layer 622, and then the conductive layer 610 and the conductive layer 612 are selectively etched to form a conductive layer 618 and a conductive layer 620 which serve as a gate electrode (see FIG. 18B and FIG. 20B). Here, when the insulating layer 614 is selectively etched, part of the insulating layer 608 which serves as a gate insulating layer is also etched at the same time.

Next, the resist mask 616 is removed, and then, an insulating layer 624 is formed so as to cover the island-shaped semiconductor layer 606, the insulating layer 608, the conductive layer 618, the conductive layer 620, the insulating layer 622, and the like. The insulating layer 624 serves as a barrier layer at the time of forming sidewalls later. Although the insulating layer 624 can be formed using a material such as silicon oxide, silicon oxynitride, silicon nitride oxide, silicon nitride, hafnium oxide, aluminum oxide, or tantalum oxide, it is preferable to form the insulating layer 624 using a material having etching selectivity to a material used for the sidewalls later so that the insulating layer 624 serves as a barrier layer. The thickness of the insulating layer 624 may be greater than or equal to about 10 nm and less than or equal to about 200 nm. In this embodiment, the insulating layer 624 is formed using silicon nitride (thickness: 50 nm).

After the insulating layer 624 is formed, an impurity element imparting one conductivity type is added to the island-shaped semiconductor layer 606 using the conductive layer 618, the conductive layer 620, the insulating layer 622, and the like as masks. In this embodiment, an impurity element imparting n-type conductivity (e.g., phosphorus or arsenic) is added to the island-shaped semiconductor layer 606. By addition of the impurity element, impurity regions 626 are formed in the island-shaped semiconductor layer 606 (see FIG. 18C). Note that in this embodiment, after the insulating layer 624 is formed, an impurity element imparting n-type conductivity is added; however, the present invention is not limited thereto. For example, after or before the resist mask is removed, the impurity element may be added, and then the insulating layer 624 may be formed. An impurity element to be added can also be an impurity element imparting p-type conductivity.

Figure 20C:
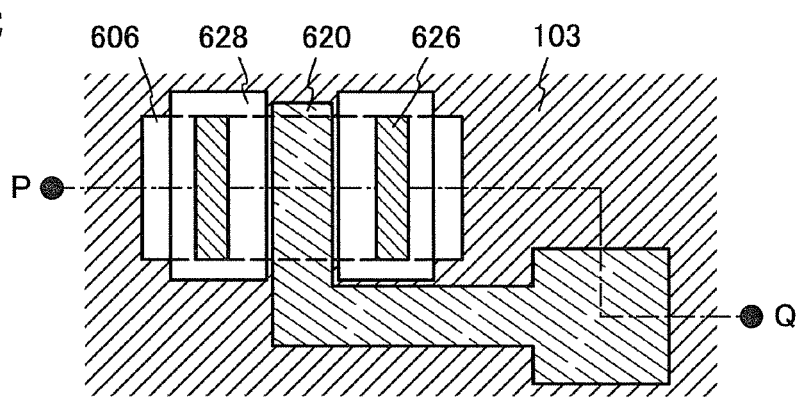

Next, sidewalls 628 are formed (see FIG. 18D and FIG. 20C). The sidewalls 628 can be formed in such a manner that an insulating layer is formed so as to cover the insulating layer 624 and anisotropic etching mainly in a perpendicular direction is performed on the insulating layer. This is because the insulating layer is selectively etched by the above-described anisotropic etching. The insulating layer can be formed using a material such as silicon oxide, silicon oxynitride, silicon nitride oxide, silicon nitride, hafnium oxide, aluminum oxide, or tantalum oxide by a CVD method, a sputtering method, or the like. Further, a film containing an organic material may be formed by a spin coating method, or the like. In this embodiment, silicon oxide is used as a material for the insulating layer. That is, the sidewalls 628 are formed using silicon oxide. In addition, as an etching gas for the above-described etching, a mixed gas of $CHF_3$ and helium can be used, for example. Note that the step of forming the sidewalls 628 are not limited thereto.

Next, an impurity element imparting one conductivity type is added to the island-shaped semiconductor layer 606 using the insulating layer 622, the sidewalls 628, and the like as masks. Note that the impurity element which is added to the island-shaped semiconductor layer 606 has the same conductivity type as the impurity element which has been added in the previous step. Here, the impurity element is added to the island-shaped semiconductor layer 606 at a higher concentration than in the previous step. That is, in this embodiment, an impurity element imparting n-type conductivity is added.

By the above-described addition of the impurity element, a channel formation region 630, low-concentration impurity regions 632, and high-concentration impurity regions 634 are formed in the island-shaped semiconductor layer 606. The low-concentration impurity regions 632 each serve as an LDD (lightly doped drain) region and the high-concentration impurity regions 634 each serve as a source or a drain.

Figure 19A:
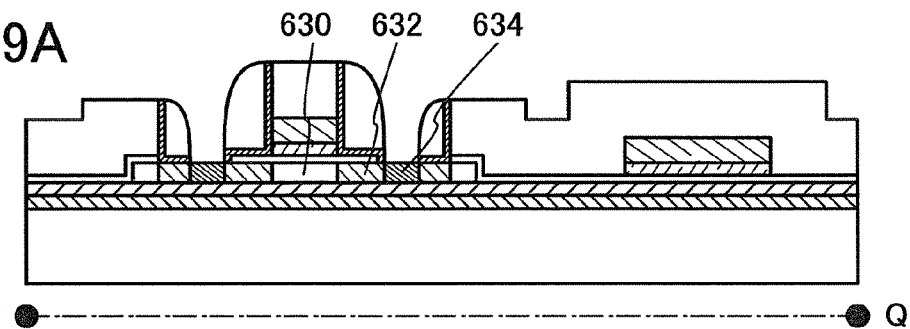
FIGS. 19A to 19C are cross-sectional views illustrating an example of a method for manufacturing a transistor.

Next, the insulating layer 624 is etched to form openings (contact holes) which reach the high-concentration impurity regions (see FIG. 19A). Since the insulating layer 622 and the sidewalls 628 are formed using silicon oxide and the insulating layer 624 is formed using silicon nitride in this embodiment, the insulating layer 624 can be selectively etched to form the openings.

Figure 19B:
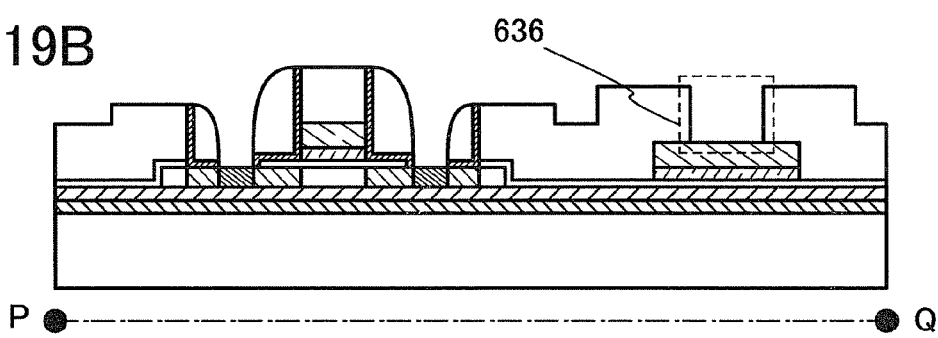

After the openings which reach the high-concentration impurity regions are formed, the insulating layer 614 is selectively etched to form an opening 636 (see FIG. 19B). The opening 636 is formed to be larger than the opening which reaches the high-concentration impurity region. This is because the opening which reaches the high-concentration impurity region is miniaturized by being formed in a self-aligned manner while a minimum line width of the opening 636 is determined in accordance with a process rule or a design rule.

After that, a conductive layer which is in contact with the high-concentration impurity regions 634 in the island-shaped semiconductor layer 606 and the conductive layer 620 is formed in the openings which reach the high-concentration impurity regions and the opening 636. The conductive layer can be formed by a CVD method, a sputtering method, or the like. As a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described metal as its main component or a compound containing the above-described metal may be used. The conductive layer may have a single-layer structure or a stacked-layer structure. In this embodiment, a case is described in which the conductive layer has a three-layer structure of titanium, aluminum, and titanium.

Figure 20D:
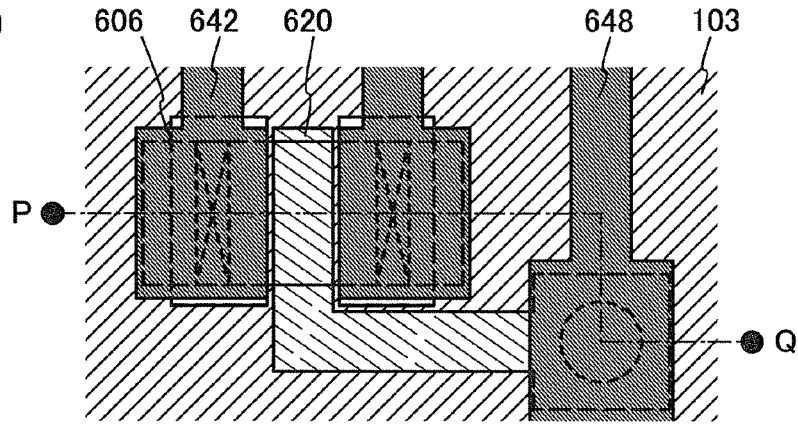

The above-described conductive layer is selectively etched to form a conductive layer 638, a conductive layer 640 and a conductive layer 642 which serve as a source or drain electrode (a source or drain wiring), a conductive layer 644, a conductive layer 646, and a conductive layer 648 which are connected to the conductive layer 620 and serve as a wiring (see FIG. 19C and FIG. 20D). Through the above-described steps, a transistor is completed in which a connection between the island-shaped semiconductor layer 606 and the conductive layers serving as the source or drain electrode is formed in a self-aligned manner.

In this manner, a transistor can be manufactured with use of an SOI substrate according to one embodiment of the present invention. The single crystal semiconductor layer of the SOI substrate according to one embodiment of the present invention has few crystal defects and is a single crystal semiconductor layer with reduced interface state density with the gate electrode layer. The single crystal semiconductor layer has a planarized surface and is thinned to a thickness of less than or equal to 50 nm. Accordingly, transistors with excellent characteristics such as low driving voltage, high electron field effect mobility, and a low sub-threshold value can be manufactured over the SOI substrate. Further, a plurality of high performance transistors with little characteristic variation between the transistors can be formed over the same substrate. In other words, with use of the SOI substrate according to one embodiment of the present invention, nonuniformity of the important characteristic value as transistor characteristics, such as threshold voltage or mobility, can be suppressed, and higher performance is possible. Note that in this embodiment, the description is made with use of the SOI substrate having a structure in which the oxide film 114, the oxide film 103, and the single crystal semiconductor layer 112 are formed in this order over the semiconductor substrate 111; however, the present invention is not construed as being limited thereto.

Since a connection relation of the source or drain electrode can be formed in a self-aligned manner by the method described in this embodiment, a structure of the transistor can be miniaturized. That is, the degree of integration of semiconductor elements can be increased. Further, since the length of the channel or the low-concentration impurity region can be determined in a self-aligned manner, variation in channel resistance, which is a problem in miniaturization, can be suppressed. That is, transistors with excellent characteristics can be provided.

Thus, a semiconductor device with high added value can be manufactured by formation of a wide variety of semi-conductor elements such as transistors using an SOI substrate according to one embodiment of the present invention.

(Embodiment 5)

Although the methods for manufacturing a transistor are described in Embodiments 3 and 4, a semiconductor device with higher added value can be manufactured by formation of a wide variety of semiconductor elements such as a capacitor and a resistor together with the transistor. Hereinafter, specific modes of semiconductor devices will be described with reference to drawings. Note that in this embodiment, elements similar to those in the above embodiments are indicated by the same reference numerals, and detailed descriptions thereof are omitted.

Figure 21:
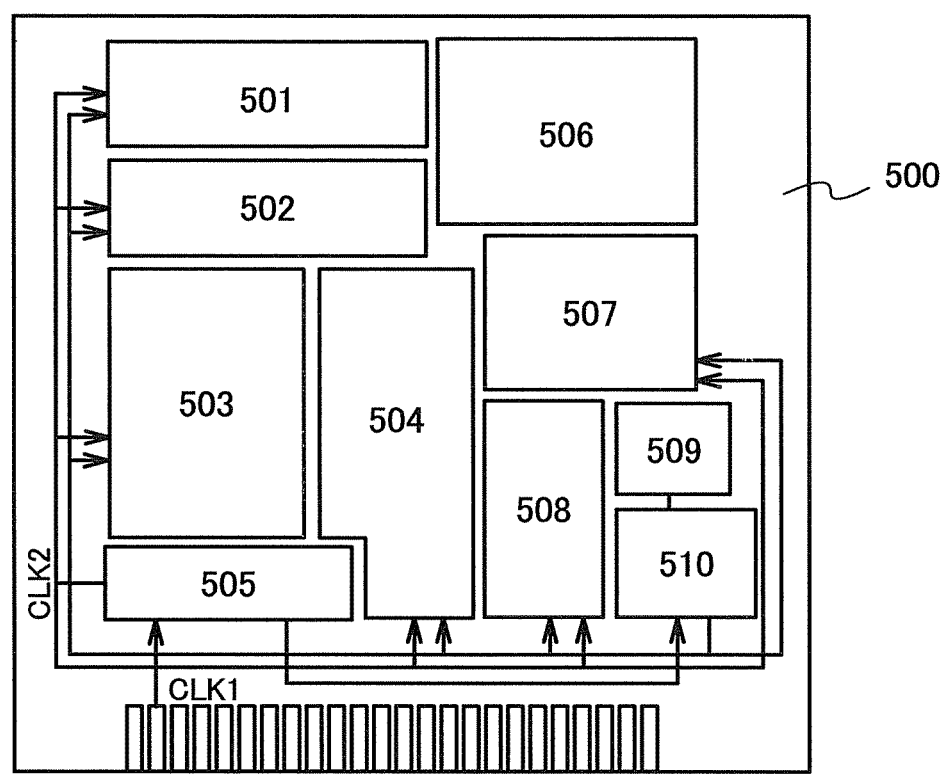
FIG. 21 is a block diagram illustrating an example of a structure of a microprocessor.

First, as an example of a semiconductor device, a microprocessor will be described. FIG. 21 is a block diagram illustrating an example of a structure of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform a variety of controls based on the decoded instruction.

The ALU controller 502 generates a signal for controlling the operation of the arithmetic logic unit 501. While the microprocessor 500 is executing a program, the interrupt controller 504 judges an interrupt request from an external input/output device or a peripheral circuit based on its priority or a mask state, and processes the interrupt request. The register controller 507 generates an address of the register 506, and reads/writes data from/to the register 506 in accordance with the state of the microprocessor 500.

For example, the timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 21, the internal clock signal CLK2 is input to another circuit.

Since an integrated circuit in the microprocessor 500 is formed using the single crystal semiconductor layer 112 with reduced crystal defects and uniform crystal orientation, not only higher processing speed but also lower power consumption can be achieved.

Figure 22:
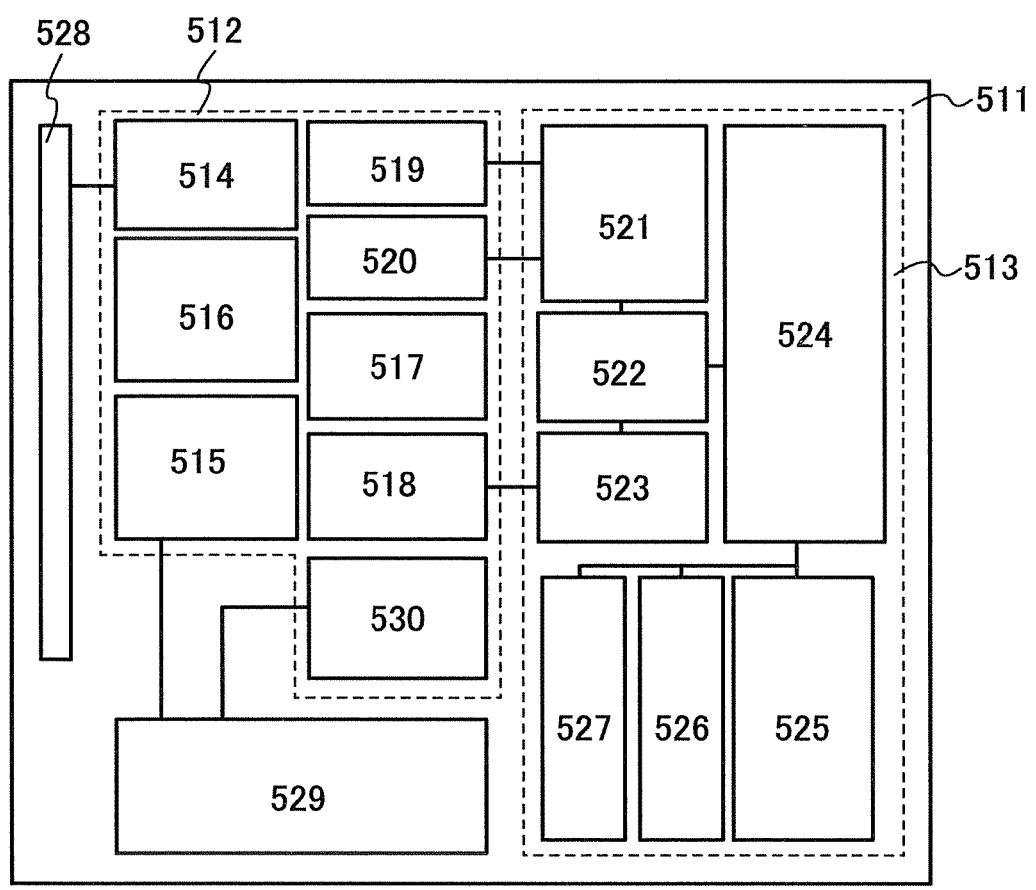
FIG. 22 is a block diagram illustrating an example of a structure of an RFCPU.

Next, an example of a semiconductor device having a function of transmitting and receiving data wirelessly and also having an arithmetic function will be described. FIG. 22 is a block diagram illustrating an example of a structure of such a semiconductor device. The semiconductor device illustrated in FIG. 22 can be called a computer which operates by communicating signals with an external device by wireless communication (hereinafter the computer is referred to as an RFCPU).

As illustrated in FIG. 22, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 is roughly described below. The resonance circuit 514 generates induced electromotive force based on a signal received by an antenna 528. The induced electromotive force is stored in a capacitor portion 529 via the rectifier circuit 515. The capacitor portion 529 is preferably a capacitor such as a ceramic capacitor or an electric double layer capacitor. The capacitor portion 529 is not necessarily integrated over the same substrate as the RFCPU 511 and may be incorporated into the RFCPU 511 as another component.

The reset circuit 517 generates a signal which resets the digital circuit portion 513 to be initialized. For example, the reset circuit generates a signal which rises after rise in the supply voltage with delay as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal which is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Since an integrated circuit in the RFCPU is formed using the single crystal semiconductor layer 112 with reduced crystal defects and uniform crystal orientation, not only higher processing speed but also lower power consumption can be achieved. Accordingly, even when the capacitor portion 529 which supplies electric power is miniaturized, long-term operation is ensured.

(Embodiment 6)

Figure 23A:
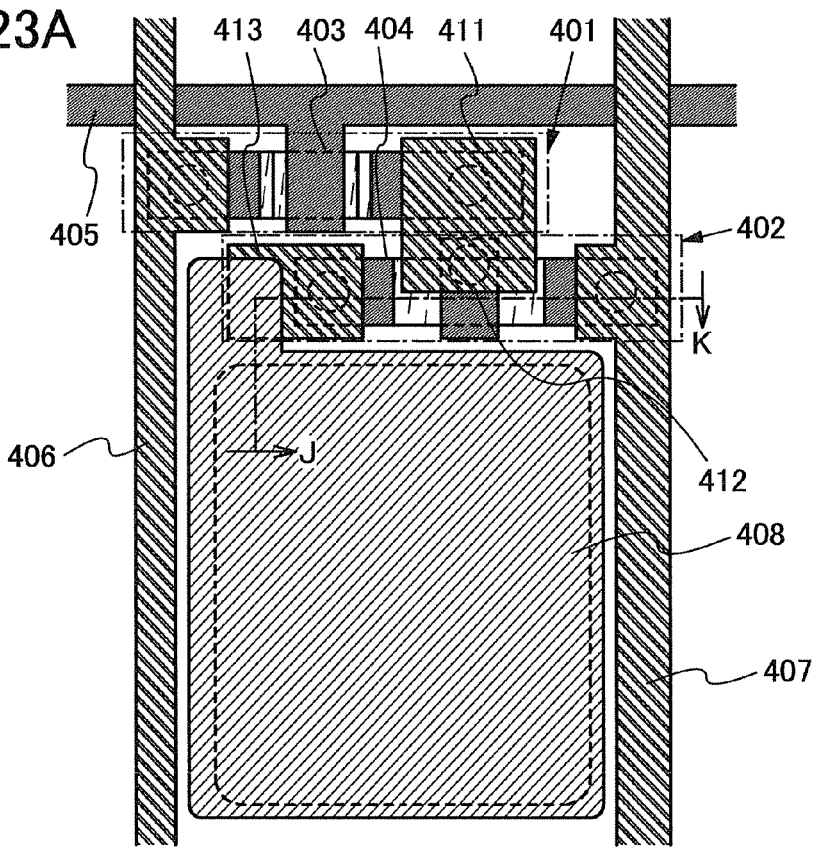
FIG. 23A is a plan view of a pixel of an electroluminescence display device and FIG. 23B is a cross-sectional view taken along the line J-K in FIG. 23A.
Figure 23B:
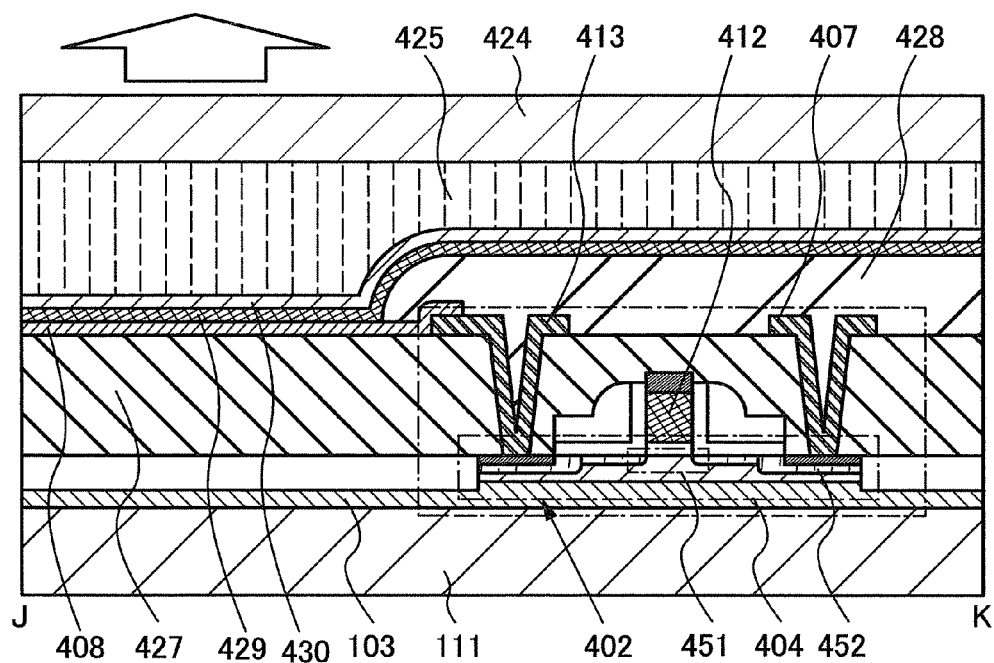

In this embodiment, an electroluminescence display device (hereinafter referred to as an "EL display device") using an SOI substrate according to one embodiment of the present invention will be described with reference to FIGS. 23A and 23B. FIG. 23A is a plan view of a pixel of an EL display device, and FIG. 23B is a cross-sectional view taken along the line J-K in FIG. 23A. FIGS. 23A and 23B illustrate a case where a top emission type structure is employed in which light is emitted in the direction of the arrows illustrated in the drawing.

As illustrated in FIG. 23A, the pixel includes a selection transistor 401 and a display control transistor 402, a scanning line 405, a signal line 406, a current supply line 407, and a pixel electrode 408. In the EL display device, each pixel is provided with a light-emitting element having a structure in which a layer including an electroluminescence material (this layer is also referred to as an "EL layer") is sandwiched between a pair of electrodes. One of the electrodes of the light emitting element is the pixel electrode 408.

A single crystal semiconductor layer 403 included in the selection transistor 401 and a single crystal semiconductor layer 404 included in the display control transistor 402 are layers each of which is formed using the single crystal semiconductor layer 112 bonded to the semiconductor substrate 111 according to one embodiment of the present invention, from which impurities such as metal are removed and in which crystal defects are reduced.

Further, a channel formation region, a source region, and a drain region of the selection transistor 401 are formed using the single crystal semiconductor layer 403. A channel formation region, a source region, and a drain region of the display control transistor 402 are formed using the single crystal semiconductor layer 404.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

The display control transistor 402 is a p-channel FET. As illustrated in FIG. 23B, a channel formation region 451 and p-type impurity regions 452 are formed in the single crystal semiconductor layer 404. Note that as an SOI substrate, an SOI substrate manufactured in Embodiments 1 and 2 is used.

An interlayer insulating film 427 is formed so as to cover the gate electrode 412 of the display control transistor 402. Over the interlayer insulating film 427, the signal line 406, the current supply line 407, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. The EL layer 429 is formed over the pixel electrode 408, and a counter electrode 430 is formed over the EL layer 429. A counter substrate 424 is provided as a reinforcing plate and fixed to the semiconductor substrate 111 with a resin layer 425.

The gray scale of the EL display device can be controlled by a current driving method in which luminance of a light-emitting element is controlled by current or a voltage driving method in which luminance of a light-emitting element is controlled by voltage. It is difficult to employ the current driving method when transistors have characteristic values which are largely different between pixels, and therefore a correction circuit which corrects variations in characteristics is needed. However, since an SOI substrate manufactured by a method for manufacturing an SOI substrate according to one embodiment of the present invention has few crystal defects, a plurality of high-performance transistors with little variation in characteristics can be formed over the same substrate. Accordingly, an EL display device is manufactured using an SOI substrate according to one embodiment of the present invention, whereby characteristic variation of the selection transistor 401 and the display control transistor 402 between pixels is reduced. Therefore, the current driving method can be employed.

(Embodiment 7)

Semiconductor devices such as transistors can be manufactured using an SOI substrate according to one embodiment of the present invention, and a variety of electronic devices can be completed using the semiconductor device. Since a concentration of impurities contained in a single crystal semiconductor layer provided in an SOI substrate according to one embodiment of the present invention is decreased, by use of the single crystal semiconductor layer as an active layer, a semiconductor element in which leakage current is reduced and electric characteristics are improved can be manufactured. Further, since the crystal defects are reduced in the single crystal semiconductor layer, localized level density at an interface with a gate insulating layer can be reduced. Furthermore, since the single crystal semiconductor layer has high planarity, a gate insulating layer which is thin and has high withstand voltage can be formed over the single crystal semiconductor layer, and improvement in mobility or an S value, or suppression of short channel effects of a semiconductor element to be manufactured, can be realized. That is, with use of an SOI substrate according to one embodiment of the present invention, a highly reliable semiconductor element with high current drive capability can be manufactured. As a result, electronic devices as final products can be manufactured with high throughput and high quality. A variety of semiconductor devices can be manufactured by use of the semiconductor element. In this embodiment, a specific example will be described with reference to drawings. Note that in this embodiment, elements similar to those in the above embodiments are indicated by the same reference numerals, and detailed descriptions thereof are omitted.

Figure 24A:
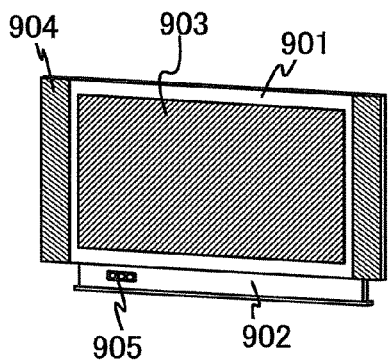
FIGS. 24A to 24F are diagrams illustrating examples of electronic devices using an SOI substrate.

FIG. 24A illustrates a display device including a chassis 901, a supporting base 902, a display portion 903, a speaker portion 904, video input terminals 905, and the like. This display device is manufactured using a transistor manufactured by a manufacturing method described in other embodiments for a driver IC, the display portion 903, and the like. Note that the display device includes a liquid crystal display device, a light-emitting display device, and the like in its category, and further includes all the information displaying devices for computers, television reception, advertisement display, and the like. Specifically, a display, a head mount display, a reflection type projector, and the like can be given.

Figure 24B:
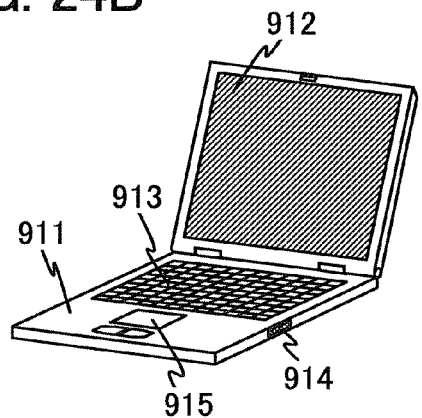

FIG. 24B illustrates a computer including a chassis 911, a display portion 912, a keyboard 913, an external connection port 914, a pointing device 915, and the like. A transistor manufactured according to one embodiment of the present invention can be applied not only to a pixel portion in the display portion 912 but also to a semiconductor device such as a driver IC for display, a CPU inside a main body, or a memory.

Figure 24C:
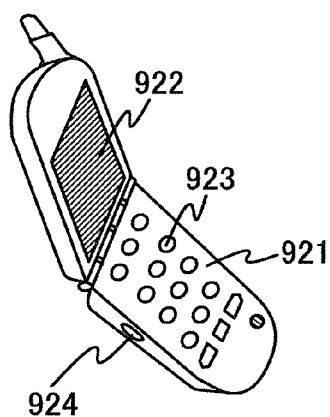

FIG. 24C illustrates a mobile phone, which is a typical example of mobile information processing terminals. This mobile phone includes a chassis 921, a display portion 922, operation keys 923, and the like. A transistor manufactured according to one embodiment of the present invention can be applied not only to a pixel portion in the display portion 922 or a sensor portion 924 but also to a driver IC for display, a memory, an audio processing circuit, and the like. The sensor portion 924 includes an optical sensor element, by which the luminance of the display portion 922 is controlled according to the illuminance of the sensor portion 924, and by which the lighting of the operation keys 923 is controlled according to the illuminance of the sensor portion 924. Thus, the power consumption of the mobile phone can be suppressed.

The semiconductor device manufactured according to one embodiment of the present invention can be applied to an electronic device such as personal digital assistants (PDA), a digital camera, a small game machine, or a mobile sound reproducing device, in addition to the above-described mobile phone. For example, it is possible to apply the semiconductor device to a functional circuit such as a CPU, a memory, or a sensor; pixel portions of those electronic devices; or a driver IC for display thereof.

Figure 24D:
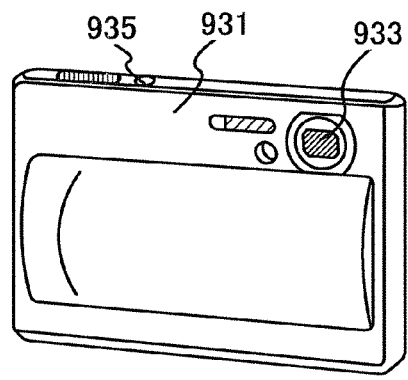
Figure 24E:
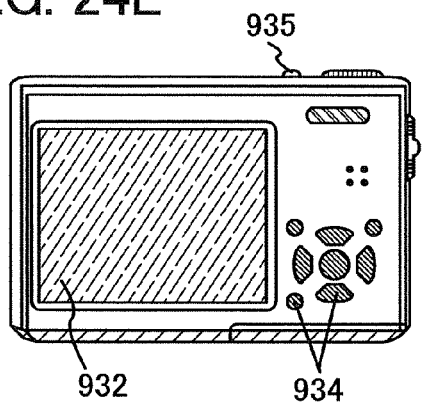

FIGS. 24D and 24E illustrate a digital camera. Note that FIG. 24E illustrates the backside of the mobile phone illustrated in FIG. 24D. The digital camera includes a chassis 931, a display portion 932, a lens 933, operation keys 934, a shutter button 935, and the like. A transistor manufactured according to one embodiment of the present invention can be applied to a pixel portion of the display portion 932, a driver IC for driving the display portion 932, a memory, and the like.

Figure 24F:
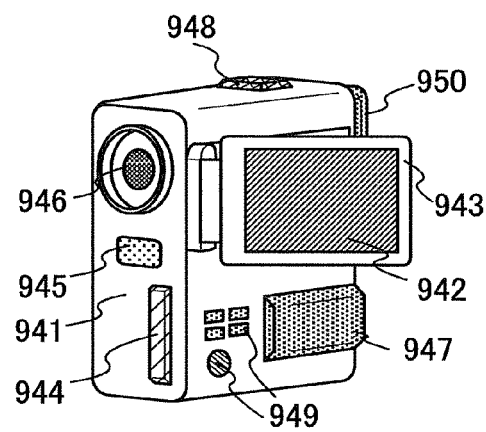

FIG. 24F illustrates a digital video camera, which includes a main body 941, a display portion 942, a chassis 943, an external connection port 944, a remote control receiving portion 945, an image receiving portion 946, a battery 947, an audio input portion 948, operation keys 949, an eyepiece portion 950, and the like. A transistor manufactured according to one embodiment of the present invention can be applied to a pixel portion of the display portion 942, a driver IC for controlling the display portion 942, a memory, a digital input processing device, and the like.

Besides, a transistor manufactured according to one embodiment of the present invention can be applied to a navigation system, a sound reproducing device, an image reproducing device provided with a recording medium, and the like. A transistor manufactured according to one embodiment of the present invention can be applied to pixel portions of display portions of the above-described devices, a driver IC for controlling the display portion, a memory, a digital input processing device, a sensor portion, and the like.

Figure 25A:
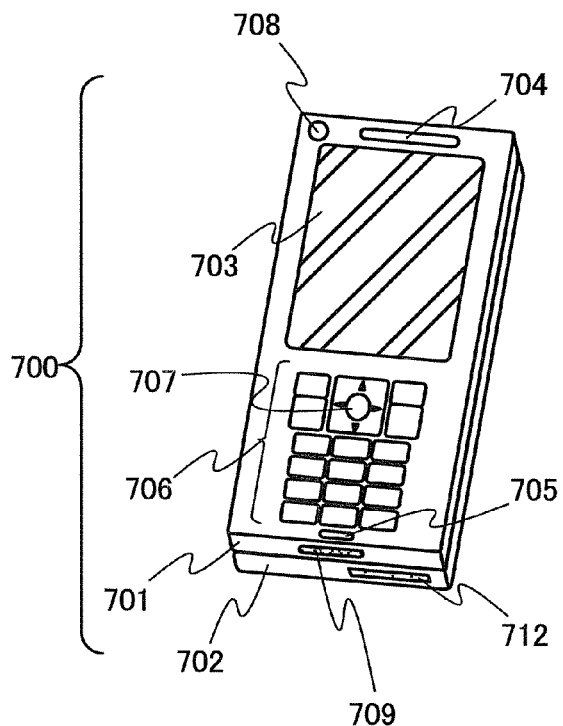
FIGS. 25A to 25C are diagrams illustrating an example of an electronic device using an SOI substrate.
Figure 25B:
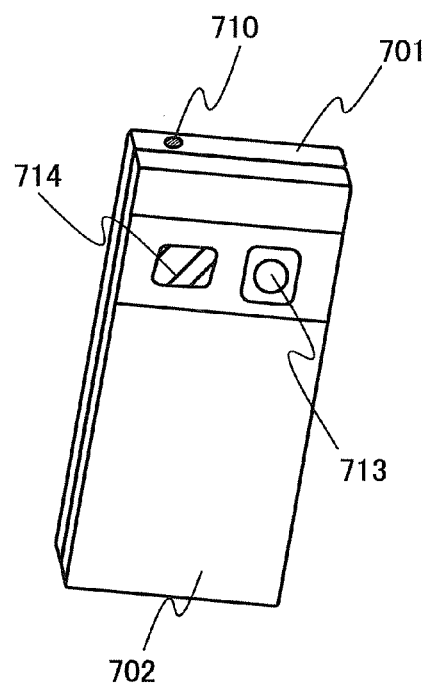
Figure 25C:
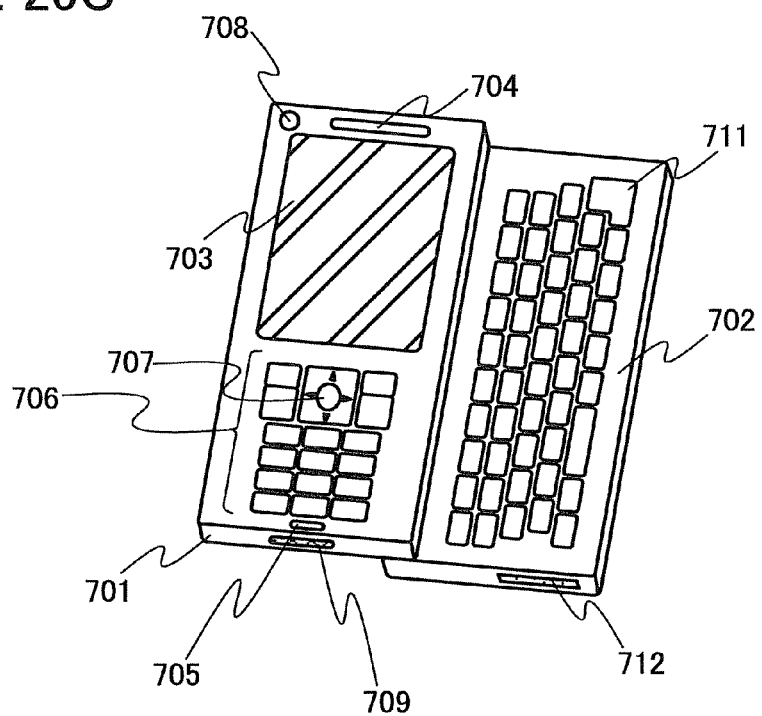

FIGS. 25A to 25C illustrate another example of a mobile phone to which one embodiment of the present invention is applied. FIG. 25A is a front view, and FIG. 25B is a rear view, and FIG. 25C is a front view in which two chassis are slid. A mobile phone 700 is a so-called smartphone which has both functions of a mobile phone and a portable information terminal, incorporates a computer, and is capable of a variety of data processing in addition to voice calls.

The mobile phone 700 has a chassis 701 and a chassis 702. The chassis 701 includes a display portion 703, a speaker 704, a microphone 705, operation keys 706, a pointing device 707, a camera lens 708, an external connection terminal 709, an earphone terminal 710, and the like. The chassis 702 includes a keyboard 711, an external memory slot 712, a rear camera 713, a light 714, and the like. In addition, an antenna is incorporated in the chassis 701. A semiconductor element manufactured according to one embodiment of the present invention can be applied to a pixel portion of the display portion 703, a driver IC for driving the display portion 703, a memory, an audio processing circuit, and the like. The EL display device illustrated in FIGS. 23A and 23B is applied to the display portion 703, whereby the display portion 703 can have excellent image quality with little display unevenness.

Further, in addition to the above-described structure, the mobile phone 700 may incorporate a non-contact IC chip, a small memory device, or the like.

The chassis 701 and 702 which overlap each other (see FIG. 25A) can be slid, whereby the mobile phone 700 is opened as illustrated in FIG. 25C. Since the camera lens 708 is provided in the same plane as the display portion 703, the mobile phone 700 can be used as a videophone. Further, a still image and a moving image can be taken with the rear camera 713 and the light 714, using the display portion 703 as a viewfinder.

With use of the speaker 704 and the microphone 705, the mobile phone 700 can be used as an audio recording device (recording device) or an audio reproducing device. With use of the operation keys 706, further, operations of incoming and outgoing of calls, simple information input such as electronic mail, scrolling of a screen, cursor movement, for example, for selecting information to be displayed on the display portion, and the like are possible.

If much information needs to be treated in documentation, use as a portable information terminal, and the like, it is convenient to use the keyboard 711. Further, the chassis 701 and the chassis 702 which overlap each other (see FIG. 25A) are slid, whereby the mobile phone 700 can be opened as illustrated in FIG. 25C. In the case of using the mobile phone 700 as a portable information terminal, smooth operation can be conducted by use of the keyboard 711 and the pointing device 707. The external connection terminal 709 can be connected to an AC adaptor and a variety of types of cables such as a USB cable, and charging and data communication with a personal computer or the like are possible. Further, a recording medium is inserted into the external memory slot 712, whereby a larger amount of data can be stored and transferred.

The backside of the chassis 702 (see FIG. 25B) is provided with the rear camera 713 and the light 714, and a still image and a moving image can be taken using the display portion 703 as a viewfinder.

Further, the mobile phone may have an infrared communication function, a USB port, a function of receiving one segment television broadcast, a non-contact IC chip, an earphone jack, or the like, in addition to the above-described functions and structures.

As described above, the applicable range of a semiconductor device manufactured according to one embodiment of the present invention is so wide that the semiconductor device can be applied to electronic devices in a variety of fields with use of an SOI substrate according to one embodiment of the present invention.

This application is based on Japanese Patent Application SER. No. 2008-079509 filed with Japan Patent Office on Mar. 26, 2008, the entire contents of which are hereby incorporated by reference.

What is claimed is:

1. A method for manufacturing a semiconductor device comprising the steps of:
    forming a first oxide film on a surface of a first semiconductor substrate by performing thermal oxidation treatment on the first semiconductor substrate;
    forming a second oxide film over the first oxide film on the first semiconductor substrate by a chemical vapor deposition method with use of TEOS gas;
    forming an embrittled region in the first semiconductor substrate by irradiating the first semiconductor substrate with hydrogen ions through the first oxide film and the second oxide film;
    forming a third oxide film on a surface of a second semiconductor substrate by performing thermal oxidation treatment on the second semiconductor substrate; and
    bonding the second semiconductor substrate and the first semiconductor substrate so as to face each other with the first oxide film, the second oxide film and the third oxide film interposed therebetween,
    wherein a first surface of the second oxide film is in contact with the first oxide film,
    wherein a second surface of the second oxide film is in contact with the third oxide film,
    wherein the second surface is an opposite side of the first surface,
    wherein the hydrogen ions include $H^+$, $H_2^+$ and $H_3^+$, and
    wherein the proportion of $H_3^+$ in the hydrogen ions is higher or equal to 50%.

2. The method for manufacturing a semiconductor device according to claim 1,
    wherein the first oxide film contains silicon oxide as its main component.

3. The method for manufacturing a semiconductor device according to claim 1,
    wherein the thermal oxidation treatment is a thermal oxidation in an atmosphere containing chlorine.

4. The method for manufacturing a semiconductor device according to claim 1,
    wherein the second semiconductor substrate is one selected from the group consisting of a single crystal silicon substrate, a polycrystalline silicon substrate, and a solar grade silicon substrate.

5. A method for manufacturing a semiconductor device, comprising the steps of:
    forming a first oxide film on a surface of a first semiconductor substrate by performing thermal oxidation treatment on the first semiconductor substrate;
    forming a second oxide film over the first oxide film on the first semiconductor substrate by a chemical vapor deposition method with use of TEOS gas;
    forming an embrittled region in the first semiconductor substrate by irradiating the first semiconductor substrate with hydrogen ions through the first oxide film and the second oxide film;
    forming a third oxide film on a surface of a second semiconductor substrate by performing thermal oxidation treatment on the second semiconductor substrate; and
    bonding the second semiconductor substrate and the first semiconductor substrate so as to face each other with the first oxide film, the second oxide film and the third oxide film interposed therebetween,
    wherein a first surface of the second oxide film is in contact with the first oxide film,
    wherein a second surface of the second oxide film is in contact with the third oxide film,
    wherein the second surface is an opposite side of the first surface,
    wherein the hydrogen ions include $H^+$, $H_2^+$ and $H_3^+$,
    wherein the proportion of $H_3^+$ in the hydrogen is higher or equal to 50%, and wherein a thickness of the third oxide film is greater than or equal to 10 nm to smaller than or equal to 1000 nm.

6. The method for manufacturing a semiconductor device according to claim 5,
wherein the first oxide film contains silicon oxide as its main component.

7. The method for manufacturing a semiconductor device according to claim 5,
wherein the thermal oxidation treatment is a thermal oxidation in an atmosphere containing chlorine.

8. The method for manufacturing a semiconductor device according to claim 5,
wherein the second semiconductor substrate is one selected from the group consisting of a single crystal silicon substrate, a polycrystalline silicon substrate, and a solar grade silicon substrate.

* * * * *

UNITED STATES PATENT AND TRADEMARK OFFICE
CERTIFICATE OF CORRECTION

PATENT NO. : 9,633,892 B2
APPLICATION NO. : 12/410643
DATED : April 25, 2017
INVENTOR(S) : Shunpei Yamazaki et al.

It is certified that error appears in the above-identified patent and that said Letters Patent is hereby corrected as shown below:

In the Specification

Column 5, Line 27, "0.5 vol % to 10 vol % (preferably 3 vol %)" should read --0.5 vol.% to 10 vol.% (preferably 3 vol.%)--;

Column 16, Line 32, "defmed" should read --defined--;

Column 22, Line 23, "80 kV," should read --80kV;--;

Column 25, Line 41, "SOT" should read --SOI--;

Column 37, Line 57, "SER" should read --serial--;

In the Claims

Claim 5, at Column 38, Line 66, "hydrogen is" should read --hydrogen ions is--.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*